(12) United States Patent
Bui et al.

(10) Patent No.: US 7,880,258 B2
(45) Date of Patent: Feb. 1, 2011

(54) THIN WAFER DETECTORS WITH IMPROVED RADIATION DAMAGE AND CROSSTALK CHARACTERISTICS

(75) Inventors: Peter Steven Bui, Westminster, CA (US); Narayan Dass Taneja, Long Beach, CA (US)

(73) Assignee: UDT Sensors, Inc., Hawthorne, CA (US)

( * ) Notice: Subject to any disclaimer, the term of this patent is extended or adjusted under 35 U.S.C. 154(b) by 1314 days.

(21) Appl. No.: 11/081,366

(22) Filed: Mar. 16, 2005

(65) Prior Publication Data

US 2008/0128846 A1    Jun. 5, 2008

(51) Int. Cl.
*H01L 31/06* (2006.01)
*H01L 31/00* (2006.01)

(52) U.S. Cl. .................. 257/465; 257/443; 257/459; 257/461; 257/E27.133

(58) Field of Classification Search .............. 257/443, 257/446, 448, 459, 461, 465, 466, 233, E27.133
See application file for complete search history.

(56) References Cited

U.S. PATENT DOCUMENTS

| | | | |
|---|---|---|---|
| 3,041,226 | A | 6/1962 | Pennington |
| 3,713,921 | A | 1/1973 | Fleischer et al. |
| 3,765,969 | A | 10/1973 | Kragness et al. |
| 3,801,390 | A | 4/1974 | Lepselter et al. |
| 3,808,068 | A | 4/1974 | Johnson et al. |
| 4,210,923 | A | 7/1980 | North et al. |
| 4,290,844 | A | 9/1981 | Rotolante et al. |
| 4,874,939 | A | 10/1989 | Nishimoto et al. |
| 4,887,140 | A | 12/1989 | Wang |
| 4,904,608 | A | 2/1990 | Gentner et al. |
| 4,904,861 | A | 2/1990 | Epstein et al. |
| 4,998,013 | A | 3/1991 | Epstein et al. |

(Continued)

FOREIGN PATENT DOCUMENTS

EP    0 347 157    12/1989

(Continued)

OTHER PUBLICATIONS

Y. Atatsu, Y. Muramoto, K. Kato, M. Ikeda, M. Ueki, A. Kozen, T. Kurosaki, K. Kawano, and J. Yoshida, "Long-wavelength multimode waveguide photodiodes suitable for hybrid optical module integrated with planar lightwave circuit", Electron. Lett., vol. 31, pp. 2098-2100, 1995.

(Continued)

*Primary Examiner*—Shouxiang Hu
(74) *Attorney, Agent, or Firm*—Novel IP

(57) ABSTRACT

The present invention is directed toward a detector structure, detector arrays, and a method of detecting incident radiation. The present invention comprises several embodiments that provide for reduced radiation damage susceptibility, decreased affects of crosstalk, reduced dark current (current leakage) and increased flexibility in application. In one embodiment, a photodiode array comprises a substrate having at least a front side and a back side, a plurality of diode elements integrally formed in the substrate forming the array, wherein each diode element has a p+ fishbone pattern on the front side, and wherein the p+ fishbone pattern substantially reduces capacitance and crosstalk between adjacent photodiodes, a plurality of front surface cathode and anode contacts, and wire interconnects between diode elements made through a plurality of back surface contacts.

5 Claims, 19 Drawing Sheets

U.S. PATENT DOCUMENTS

| | | | |
|---|---|---|---|
| 5,049,962 A | 9/1991 | Huang et al. | |
| 5,053,318 A | 10/1991 | Gulla et al. | |
| 5,144,379 A | 9/1992 | Eshita et al. | |
| 5,214,276 A | 5/1993 | Himoto et al. | |
| 5,237,197 A | 8/1993 | Snoeys et al. | |
| 5,252,142 A | 10/1993 | Matsuyama et al. | |
| 5,254,480 A | 10/1993 | Tran | |
| 5,276,955 A | 1/1994 | Noddin et al. | |
| 5,408,122 A | 4/1995 | Reele | |
| 5,430,321 A | 7/1995 | Effelsberg | |
| 5,446,751 A | 8/1995 | Wake | |
| 5,501,990 A | 3/1996 | Holm et al. | |
| 5,576,559 A | 11/1996 | Davis | |
| 5,599,389 A | 2/1997 | Iwasaki | |
| 5,656,508 A | 8/1997 | So et al. | |
| 5,818,096 A | 10/1998 | Ishibashi et al. | |
| 5,825,047 A | 10/1998 | Ajisawa et al. | |
| 5,869,834 A | 2/1999 | Wipenmyr | |
| 5,889,313 A | 3/1999 | Parker | |
| 5,923,720 A | 7/1999 | Barton et al. | |
| 5,928,438 A | 7/1999 | Salami et al. | |
| 6,027,956 A | 2/2000 | Irissou | |
| 6,218,684 B1 * | 4/2001 | Kuhara et al. | 257/184 |
| 6,326,300 B1 | 12/2001 | Liu et al. | |
| 6,326,649 B1 | 12/2001 | Chang et al. | |
| 6,352,517 B1 | 3/2002 | Flock et al. | |
| 6,426,991 B1 | 7/2002 | Mattson et al. | |
| 6,438,296 B1 | 8/2002 | Kongable | |
| 6,489,635 B1 | 12/2002 | Sugg | |
| 6,504,158 B2 | 1/2003 | Possin | |
| 6,510,195 B1 | 1/2003 | Chappo et al. | |
| 6,546,171 B2 | 4/2003 | Fukutomi | |
| 6,569,700 B2 | 5/2003 | Yang | |
| 6,593,636 B1 | 7/2003 | Bui et al. | |
| 6,670,258 B2 | 12/2003 | Carlson et al. | |
| 6,734,416 B2 | 5/2004 | Carlson et al. | |
| 6,772,729 B2 * | 8/2004 | Brosseau et al. | 123/308 |
| 6,826,080 B2 | 11/2004 | Park et al. | |
| 7,057,254 B2 * | 6/2006 | Bui et al. | 257/443 |
| 7,112,465 B2 * | 9/2006 | Goushcha et al. | 438/73 |
| 7,242,069 B2 * | 7/2007 | Bui et al. | 257/443 |
| 7,256,470 B2 | 8/2007 | Bui et al. | |
| 7,279,731 B1 | 9/2007 | Bui et al. | |
| 2001/0034105 A1 * | 10/2001 | Carlson | 438/380 |
| 2002/0056845 A1 | 5/2002 | Iguchi et al. | |
| 2004/0104351 A1 | 6/2004 | Shibayama | |
| 2004/0206886 A1 | 10/2004 | Carlson et al. | |
| 2004/0222358 A1 | 11/2004 | Bui et al. | |
| 2004/0222482 A1 | 11/2004 | Bui et al. | |
| 2004/0241897 A1 | 12/2004 | Rhee et al. | |
| 2004/0262652 A1 | 12/2004 | Goushcha et al. | |
| 2006/0220078 A1 | 10/2006 | Bui et al. | |
| 2006/0255420 A1 | 11/2006 | Bui et al. | |
| 2006/0278898 A1 * | 12/2006 | Shibayama | 257/228 |
| 2007/0090394 A1 | 4/2007 | Bui et al. | |
| 2007/0257329 A1 | 11/2007 | Bui et al. | |
| 2007/0278534 A1 | 12/2007 | Bui et al. | |
| 2007/0296005 A1 | 12/2007 | Bui et al. | |
| 2008/0067622 A1 | 3/2008 | Bui et al. | |
| 2008/0128846 A1 | 6/2008 | Bui et al. | |
| 2008/0277753 A1 | 11/2008 | Bui et al. | |

FOREIGN PATENT DOCUMENTS

| | | |
|---|---|---|
| EP | 0 436 282 A2 | 11/1990 |
| EP | 0 723 301 A2 | 5/1997 |
| EP | 1 069 626 A2 | 1/2001 |
| EP | 1 205 983 A1 | 5/2002 |
| WO | WO/00/52766 | 9/2000 |

OTHER PUBLICATIONS

Fukano et al., "High-REsponsivity and Low-Operation-Voltage Edge-Illuminated Refracting-Facet Photodiodes with Large Alignment Tolerance for Single-Mode Fiber", Journal of Lightwave Technology, vol. 16, No. 5, May 1997.

* cited by examiner

DETAIL "A"

THIN WAFER DETECTORS WITH IMPROVED RADIATION DAMAGE AND CROSSTALK CHARACTERISTICS

CROSS REFERENCE TO RELATED APPLICATIONS

This invention relies on, for priority, U.S. patent application Ser. No. 10/838,987, having a filing date of May 5, 2004, entitled "THIN WAFER DETECTORS WITH IMPROVED RADIATION AND CROSSTALK CHARACTERISTICS" which further relies on Provisional Application 60/468,181, having a priority date of May 5, 2003, entitled "DETECTORS WITH IMPROVED RADIATION DAMAGE AND CROSSTALK CHARACTERISTICS".

FIELD OF THE INVENTION

The present invention pertains generally to the field of radiation detectors, and in particular, relates to radiation detectors manufactured with a fishbone structure to reduce both capacitance and crosstalk between detecting regions.

BACKGROUND OF THE INVENTION

Arrays of photosensitive diodes are used in an assortment of applications including, but not limited to, radiation detection, optical position encoding, and low light-level imaging, such as night photography, nuclear medical imaging, photon medical imaging, multi-slice computer tomography (CT) imaging, and ballistic photon detection etc. Typically, photodiode arrays may be formed as one- or two-dimensional arrays of aligned photodiodes, or, for optical shaft encoders, a circular or semicircular arrangement of diodes.

One problem with detection devices is that they are susceptible to various radiation damage mechanisms, such as displacement damage resulting in total dose effects and ionization damage resulting in bulk effects. Both these mechanisms adversely affect the performance of detectors, transistors and integrated circuits.

Certain detector characteristics that are most affected include detector leakage current, doping characteristics, charge collection, and carrier lifetime. Over time, detectors show an increased reverse-bias current and decreased forward voltage due to radiation damage. Further, a change in doping level, due to radiation damage, adversely affects the width of the depletion region, i.e. the voltage required for full depletion and a decrease in carrier lifetime results in signal loss as carriers recombine while traversing the depletion region.

Another disadvantage with conventional detection devices is the amount and extent of crosstalk that occurs between adjacent detector structures, primarily as a result of minority carrier leakage current between diodes. The problem of crosstalk between diodes becomes even more acute as the size of the detector arrays, the size of individual detectors, the spatial resolution, and spacing of the diodes is reduced.

In certain applications, it is desirable to produce optical detectors having small lateral dimensions and spaced closely together. For example in certain medical applications, it would beneficial to increase the optical resolution of a detector array in order to permit for improved image scans, such as computer tomography scans. However, at conventional doping levels utilized for diode arrays of this type, the diffusion length of minority carriers generated by photon interaction in the semiconductor is in the range of at least many tens of microns, and such minority carriers have the potential to affect signals at diodes away from the region at which the minority carriers were generated. Therefore, the spatial resolution obtainable may be limited by diffusion of the carriers within the semiconductor itself, even if other components of the optical system are optimized and scattered light is reduced.

The conduction process in semiconductor devices is accomplished via two types of current flow: hole current and electron current. More specifically, energy can be added to electrons via external sources of energy, such as light and heat. When excess energy is absorbed by valence electrons, covalent bonds may be broken. Once the bonds are broken, the electrons move to the conduction band where they are capable of supporting electric current. When a voltage is applied to a crystal substance containing the conduction band electrons, the electrons move through the crystal toward the applied voltage, thus creating electron current flow.

In contrast, a hole results when a covalent bond is broken and a vacancy is left in the atom by the missing valence electron. The hole has a positive charge because its corresponding atom is deficient by one electron. As a result of this positive charge, a chain reaction begins when a nearby electron breaks its covalent bond to fill the hole, thus leaving another hole in an adjacent atom. This process continues, resulting in a covalent bond in the atom with the original hole and a resulting hole in the adjacent atom. Although the electron has moved from one covalent bond to another, the hole is also moving through adjacent or nearby atoms. Thus, since this conduction process results from the movement of holes rather than electrons, it is referred to as hole flow (hole current flow or conduction by holes).

Hole flow is similar to electron flow, except that the holes move toward a negative potential and in an opposite direction to that of the electrons. For example, electrons flow from negative to positive potential, whereas hole flow moves from a positive to negative potential. Majority carriers are the more abundant charge carriers, while less abundant carriers are referred to as minority carriers. In an n-type semiconductor material, electrons are the majority carriers and holes are the minority carriers. In a p-type semiconductor material, the opposite is true, thus holes are the majority carriers and electrons are the minority carriers. Since hole flow results from the breaking of covalent bonds at the valence band level, the electrons associated with this conduction must remain in the valence band. In contrast, electrons associated with electron flow, however, have conduction band energy and can move throughout the crystal.

Drift current is charged particle motion in response to an applied electric field. When an electric field is applied across a semiconductor, the carriers start moving, thus producing a current. The positively charged holes move with the electric field while the negatively charged electrons move against the electric field. The motion of each carrier is referred to as constant drift velocity, or $v_d$, taking into consideration the collisions and setbacks each carrier has while in transit. Note that the sum total of the carriers will eventually travel in the direction they are supposed to regardless of any setbacks or collisions.

The drift current is thus the result of carrier drift, and depends upon the ability of the carriers to move around, or electron and hole mobility. The carrier concentration is another parameter that affects drift current, simply because carriers have to be present for there to be current. Yet another parameter that is measured with drift current, is the current density, which depends upon the electric field, electron or hole concentration (−/+q), the mobility constant, and the charge. Note than when a negative electric field is applied, the electrons (−q) will travel opposite the electric field, thus the resulting drift current will be positive.

Diffusion is the process of particles dispersing from regions of high concentration to regions of low concentration. If this process is left undisturbed, there will eventually be a uniform distribution of particles. Diffusion does not require external forces to act upon a group of particles. The particles move about using thermal motion. If the particles are carriers, they "carry" charge with them, thus resulting in current, and therefore diffusion current. Diffusion current will occur even when there is no electric field applied to the semiconductor. $D_p$, and $D_n$ are called the diffusion coefficients, a proportionality factor. In addition, the direction of the diffusion current depends on the change in the carrier concentrations, not the concentrations themselves. Usually +q is assigned to holes whereas −q to electrons, because the carriers are diffusing from areas of high concentrations to areas of low concentrations.

Drift current and diffusion current comprise the total current in a semiconductor, although they may not be occurring simultaneously. Under equilibrium conditions, the current density should be zero because no electric field is applied. If the doping is not completely uniform, however, there will be a change in concentration in some places in the semiconductor, resulting in a gradient. This gradient may give rise to an electric field, which in turn can result in non-zero current densities.

As mentioned above, in order for current to exist, electrons and holes must move and transport charge, or exhibit mobility. Several factors can affect the mobility of a carrier, the most significant of which is scattering, or the motion-impending collisions within the crystal. These collisions can occur with an electron bumping into another electron, a hole, or even ionized impurities. Scattering may increase or decrease, depending upon factors such as temperature and/or the addition of electron acceptors/donors. In general, the higher the temperature, the more excited the carriers are, and therefore the greater the increase in scattering. The same phenomenon occurs with dopants, as not only will there be more carriers to bump into and scatter, but dopants will generate an ionized impurity that will also carry a charge. Mobility is substantially independent of the doping concentration when the doping concentration is low. The mobility of the carriers begins to decrease as the concentration of the dopant increases.

Various approaches have been used to minimize such crosstalk including, but not limited to, providing inactive photodiodes to balance the leakage current, as described in U.S. Pat. Nos. 4,904,861 and 4,998,013 to Epstein et al., the utilization of suction diodes for the removal of the slow diffusion currents to reduce the settling time of detectors to acceptable levels, as described in U.S. Pat. No. 5,408,122, and providing a gradient in doping density in the epitaxial layer, as described in U.S. Pat. No. 5,430,321 to Effelsberg.

Despite attempts to improve the overall performance characteristics of photodiode arrays and their individual diode units, within detection systems, photodiode arrays capable of reducing crosstalk while being less susceptible to radiation damage are still needed. Additionally, there is need for a semiconductor circuit and an economically feasible design and fabrication method so that it is capable of improving the spatial resolution of detectors integrated therein.

SUMMARY OF THE INVENTION

The present invention is directed toward a detector structure, detector arrays, and a method of detecting incident radiation. The present invention comprises several embodiments that provide for reduced radiation damage susceptibility, decreased affects of crosstalk, reduced dark current (current leakage) and increased flexibility in application.

In one embodiment, the present invention comprises a back side illuminated photodiode array with front side contacts that minimizes the depletion region, thereby decreasing the affects of crosstalk. The fabrication of the array involves diffusing a n+ layer on the back side of the substrate, forming a deep n+ region; applying a first masking layer on the back side; applying a second masking layer on the back side; applying a photoresist mask on the back side, forming an etching pattern; using the etching pattern to etch the first masking layer, the second masking layer; removing the photoresist mask; etching the deep n+ region, and the substrate; and finally coating the back side of the substrate with an antireflective coating.

In one embodiment, the photodiode array comprises a substrate having at least a front side and a back side, a plurality of photodiodes integrally formed in the substrate forming the array, a plurality of metal contacts provided on the front side, wherein the fabrication of said array comprises (1) coating the front side of the substrate with $SiO_2$ via mask oxidation, (2) masking the front side of the substrate wafer with n+, (3) etching an oxide pattern on the front side of the substrate wafer and etching the back side of the substrate wafer with oxide, (4) diffusing a n+ layer on the front side of the substrate forming a deep n+ region, (5) applying a p+ layer on the front side of the substrate, forming an etching pattern; (6) selectively etching the front side of the substrate according to the p+ etch pattern, (7) diffusing a p+ layer on the substrate wafer, (8) applying a photoresist layer on the front side of the substrate, (9) applying an oxide layer on the back side of the substrate, (10) diffusing a shallow n+ layer on the back side of the substrate, (11) coating the back side of the substrate with an antireflective layer, (12) etching a contact window oxide on the front side of the substrate, (13) removing the contact window oxide after the etching step, and (14) metallizing, masking, and etching the front side of the substrate.

Optionally, the substrate is made of n doped silicon. The silicon substrate has a thickness ranging from 0.075 mm to 0.275 mm. The plurality of n+ and p+-doped regions are separated from a substantially uniform n+ layer by and active region. The p+ mask pattern is a narrow fishbone pattern. The narrow fishbone pattern p+ mask comprises p+ bones and is defined by a periphery frame bone. The gap between the p+ bones in said narrow fishbone pattern is preferably in a range of 100 µm to 180 µm.

Optionally, the gap between the p+ periphery frame bone and a top n+ cathode on the substrate is 25 µm. The gap between the p+ periphery frame bone and a top n+ cathode on the substrate is 50 µm. The gap between the p+ periphery frame bone and a top n+cathode on the substrate is 75 µm. The heavily doped diffusion regions are heavily doped pad layers of a selected conductivity type of either p+ doped or n+ doped.

Optionally, the antireflective coating layer is a thin film material. The thin film material is one of an oxide, a sulfide, a fluoride, a nitride, a selenide, or a metal. The antireflective coating is a silicon dioxide antireflective.

In one embodiment, a photodiode array comprises a substrate having at least a front side and a back side, a plurality of diode elements integrally formed in the substrate forming the array, wherein each diode element has a p+ fishbone pattern on the front side, and wherein the p+ fishbone pattern substantially reduces capacitance and crosstalk between adjacent photodiodes, a plurality of front surface cathode and anode contacts, and wire interconnects between diode elements made through a plurality of back surface contacts.

Optionally, the array further comprises a plurality of top cathode pads. The photodiode array comprises four top cathode pads. Each of the four top cathode pads is common to and located in the center of four diode elements. The four diode elements are located in each of four corners of said photodiode array. At least one anode pad is located in the center of each diode element.

BRIEF DESCRIPTION OF THE DRAWINGS

These and other features and advantages of the present invention will be appreciated, as they become better understood by reference to the following detailed description when considered in connection with the accompanying drawings:

FIG. 8b depicts an enlarged view of a portion of the photodiode array of the present invention, demarcated as portion "A" with a dotted circle in FIG. 8a.

DESCRIPTION OF THE INVENTION

Figure 1A:
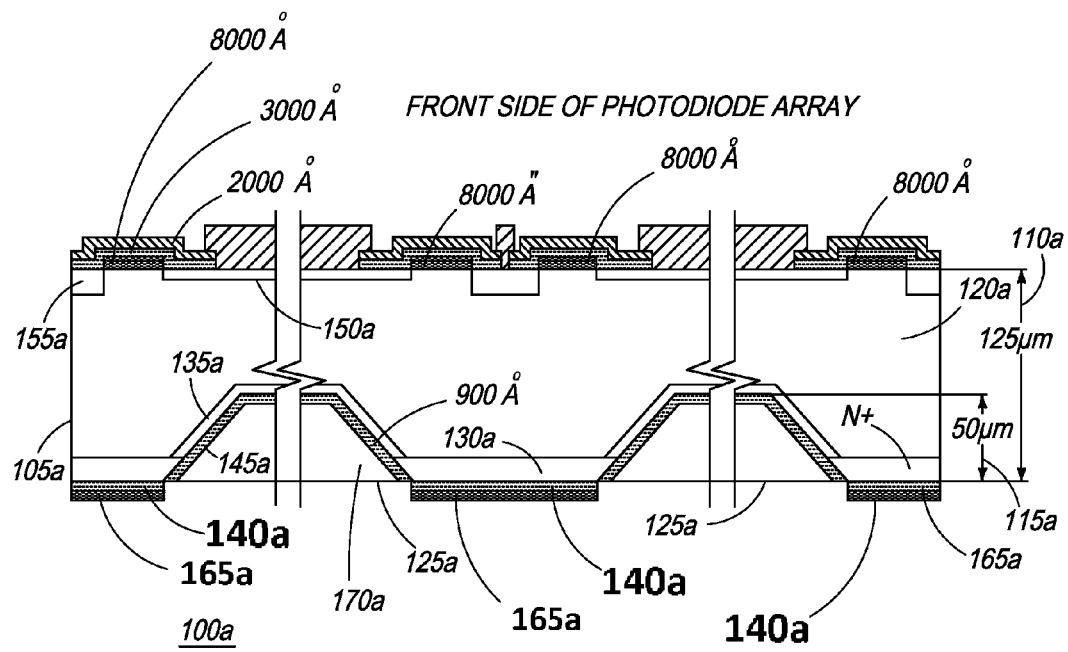
FIG. 1a is a cross sectional view of one front side of one embodiment of a back side etched, front side contact photodiode array of the present invention.

This application hereby incorporates by reference co-pending application Ser. No. 10/797,324, entitled "FRONT ILLUMINATED BACK SIDE CONTACT THIN WAFER DETECTORS", which also relies on, for priority, U.S. Provisional Application 60/468,181, having a priority date of May 5, 2003, entitled "DETECTORS WITH IMPROVED RADIATION DAMAGE AND CROSSTALK CHARACTERISTICS". The invention described therein comprises a plurality of front side illuminated photodiodes, optionally organized in the form of an array, with both the anode and cathode contact pads on the back side. The front side illuminated, back side contact (FSL-BSC) photodiodes have superior performance characteristics, including less radiation damage, less crosstalk using a suction diode, and reliance on reasonably thin wafers.

At least one invention described therein is a photodiode array having a substrate with at least a front side and a back side; a plurality of photodiodes integrally formed in the substrate forming the array wherein each photodiode has a middle layer juxtaposed between a front layer and a back layer; a plurality of electrical contacts in electrical communication with the back side; and suction diodes positioned at selected locations within the array, wherein the fabrication of said array involves a masking process comprising the steps of applying a first p+ mask on said front side and applying a second p+ mask on said back side.

The present invention is directed toward a detector structure, detector arrays, and a method of detecting incident radiation. Various modifications to the embodiments will be readily apparent to those of ordinary skill in the art, and the disclosure set forth herein may be applicable to other embodiments and applications without departing from the spirit and scope of the present invention and the claims hereto appended. Thus, the present invention is not intended to be limited to the embodiments described, but is to be accorded the broadest scope consistent with the disclosure set forth herein.

The present invention comprises several embodiments that provide for reduced radiation damage susceptibility, decreased affects of crosstalk, and increased flexibility in application. In one embodiment, the present invention comprises a back side illuminated photodiode array with a back side etching that minimizes the active area layer, thereby decreasing the affects of crosstalk. The back side etching is preferably, but by no way of limitation, in the form of "U" or "V" shaped grooves. The back side illuminated with back side etching (BSL-BE) photodiodes are implemented in an array and have superior performance characteristics, including less radiation damage due to a thinner active area, and less crosstalk due to shorter distances for minority carriers to diffuse to the PN junction.

Referring now to FIGS. 1a, 1b, 2a, and 2b, the active areas in the back side of the photodiode arrays are etched to minimize the likelihood of crosstalk while still providing the detector with sufficient strength to avoid easy breakage. FIGS. 1a, 1b, 2a, and 2b depict exemplary photodiode arrays having a first region of maximum thickness, a second region of minimum thickness, and a third region of varying thickness which depends upon the level of back side etching. The "regions" are loosely defined areas of the photodiode arrays and are described herein to illustrate the teachings of the present invention. While these regions are present in the embodiments as described in the above-mentioned figures, the specifications regarding the number of regions and their corresponding thicknesses that comprise the photodiode array are merely illustrative of the present invention and not intended to be limiting.

The first region comprises p+ regions and n+ regions that are separated by a thin active layer, minimizing the degree of crosstalk between the diodes and reducing susceptibility to radiation damage. The second region comprises a shallow n+ region and, optionally, a deep n+ region, both doped with a suitable impurity of a similar conductivity type and located close to the back side of the wafer. The second region provides the photodiode area with increased strength and resistance to breakage. The third region forms the bottom surface wall (depth) of preferably "U" or "V" shaped grooves etched into the back side of the photodiode array and spans to the front side surface of the device wafer. Ideally, the total depth of the first region would equal the total depth of the second and third regions combined.

In one embodiment, the back side illuminated photodiode arrays of the present invention have front side contacts. Referring now to FIG. 1a, an embodiment of the front side of the photodiode arrays of the present invention is depicted. Metal contact pads are provided on the front and are in electrical communication with the anode and cathode surface structures. Both regions 150a and 155a are positioned directly below the front surface of the device wafer 105a, sharing their top face with front surface of device wafer 105a. Heavily doped regions 150a and 155a may be doped with a suitable impurity of a selected conductivity type, such as p-type or n-type. Regions 150a and 155a are doped with opposite impurities of selected conductivities. For example, but not limited to such example, if region 150a is doped with a suitable impurity of selected conductivity that is p-type, then region 155a is doped with n-type. In addition, a thin region of active layer separates regions 150a and 155a. The thin active layer minimizes the degree of cross talk between diodes and reduces susceptibility to radiation damage.

Referring again to FIG. 1a, cross section 105a of one embodiment of photodiode array 100a is shown. Photodiode array 100a comprises regions, including first region 110a, second region 115a and third region 120a, with maximum, minimum, and variable thicknesses, respectively. As an example, and by no way of limitation, the three regions may possess the following specifications: first region 110a may have a thickness of approximately 125 µm, second region 115a may have a thickness of approximately 50 µm, and third region 120a may be of a varying thickness, ranging from a minimum of approximately 75 µm to a maximum of approximately 125 µm, depending on the level and pattern of etching. The above-mentioned specifications are only mentioned by way of illustration and are not binding. The specification can be easily changed to suit the design, fabrication, and functional requirements suggested herein.

First region 110a comprises two heavily doped regions, 150a and 155a, as described above. First region 110a is separated into two additional regions for ease of discussion—second region 115a and third region 120a. Second region 115a, in one embodiment, comprises shallow n+ regions 135a and deep n+ regions 130a, both doped with a suitable impurity of a similar conductivity type and located close to the back side of the wafer. Both shallow n+ regions 135a and deep n+ regions 130a may optionally be heavily doped with an impurity of similarly selected conductivity type, such as p-type or n-type. A large active area fills the depth created at the junction of both shallow n+ region 135a and deep n+ region 130a. For example, and by no way of limitation, shallow n+ region 135a is preferably 0.3 µm in thickness and deep n+ region 130a is preferably 2 µm in thickness. Second region 115a provides the photodiode array with increased strength and resistance to breakage. Third region 120a, in combination with second region 115a, forms "U" or "V" shaped etchings in the back side of photodiode (depending on the type of etching used).

Figure 2A:
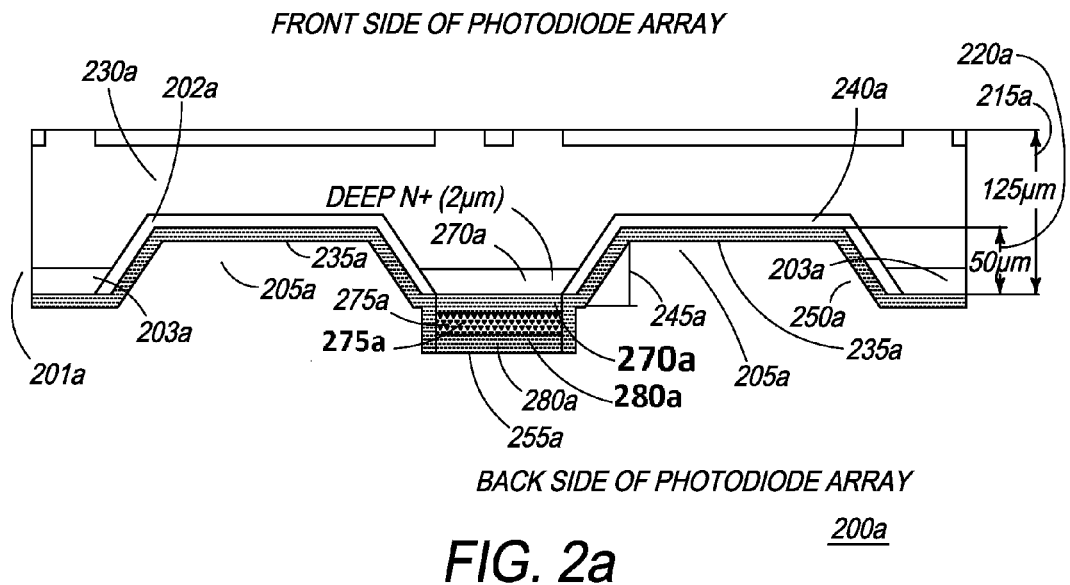
FIG. 2a is cross sectional view of an embodiment of the back side of a back side etched, front side contact photodiode array of the present invention.

Referring now to FIG. 2a, a cross sectional view of one embodiment of a single crystal semiconductor substrate or device wafer 201a having a plurality of photodiodes positioned in an array 200a therein is depicted. Note that the front side of photodiode array 200a is as depicted and described above with reference to FIG. 1a. Device wafer 201a comprises three regions, including first region 215a, second region 220a, and third region 230a, with maximum, minimum, and variable thicknesses, respectively. Various constructional details with respect to the regions in photodiode array 200a have been explained with reference to FIG. 1a above and will not be discussed here. General dimensions and relevant specifications, however, are discussed in the following paragraph and are by no way limiting to the design of this embodiment of the present invention.

Referring back to FIG. 2a, first region 215a is preferably of a thickness of approximately 125 µm and further comprises a p+ region and an n+ region, separated by a thin active layer just below the front side of device wafer 201a. Second region 220a preferably has a minimum thickness 50 µm and preferably comprises a shallow n+ region 202a and a deep n+ region 203a, both doped with a suitable impurity of a similar conductivity type. Shallow n+ region 202a is preferably 0.3 µm in thickness and deep n+ region 203a is preferably 2 µm in thickness—both located close to the back side of device wafer 201a. Deep n+ region 203a serves to reduce dark leakage current in the photodiode array.

Device wafer 201a may be made up of various materials, and is preferably, but not limited to Si or Ge. The crystal orientation of wafer 201a is preferably <1-0-0>. The back side of device wafer 201a is selectively etched, at appropriate positions via a suitable etching technique to form three dimensional (hereinafter, "3-D") microstructures therein, thus minimizing the active area layer and decreasing the affects of crosstalk. The grooves are preferably "U" or "V" shaped with a depth of approximately 50 µm from the back surface. The present invention may employ various other 3-D microstructures of varying shapes and dimensions including, but not limited to, grooves, pyramidal pits, pyramidal cavities etc. for minimizing active area layers. Such various other microstructures will be readily apparent to one of ordinary skill in the art having the benefit of this disclosure. The above specifications are not limiting with respect to the 3-D microstructures and their accompanying dimensions can be changed to suit any design, fabrication, and functional requirements.

For example, and by no way of limitation, a wet etching technique is used to form concave "V"-shaped grooves on the back side of device wafer 201a, at suitable positions, such as positions 205a, as shown in FIG. 2a. Via such wet etch technique, mono-crystalline wafers etch faster in certain crystallographic directions than in others, thereby allowing for certain layers or portions of the wafer to act as a "stop" for the etch process. This involves both a selection of appropriate wafer orientation and a suitable mask pattern for the photographic mask. Optionally, reactive ion etching (RIE) may be used to form concave grooves on the back side of device wafer 201a. The grooves formed via this technique, however, form "U"-shaped grooves. The sidewalls of such grooves are more vertical, wherein the wall is angled at less than 10 degrees.

As shown in FIG. 2a, portions of the back side of photodiode array 200a comprise three layers, forming dielectric membrane 255a. Three-layer dielectric membrane 255a forms a bridge between V-shaped grooves 235a. First layer 270a is comprised of $SiO_2$ and is preferably of a thickness of 4000 Å. $Si_3N_4$ comprises second layer 275a and is preferably of a thickness of 2000 Å. Third layer 280a of dielectric membrane 255a is comprised of $SiO_2$, as an antireflective coating, and is preferably of a thickness of 900 Å. A person of ordinary skill would appreciate that the specifications and dimensions of the components of the dielectric membrane are not limited to the abovementioned specifications and can be easily adjusted to suit varied economical, technical or operational specifications.

"V"-shaped grooves 235a etched into device wafer 201a form bottoms 240a, created at a depth 245a of the "V"-shaped groove from the backside of device wafer 201a. Sidewalls 250a extend from bottom 240a to the back side of device wafer 201a, at an angle. Preferably, "V"-shaped grooves 235a are of a depth of approximately 50 µm (depicted as 245a) and are located at a distance of approximately 75 µm from the front side of wafer 201a. A person of ordinary skill would appreciate that the specifications and dimensions of the "V"-shaped grooves etched into the wafer are not limited to the above-mentioned specifications and can be easily adjusted to suit varied economical, technical or operational specifications.

As a first manufacturing step, back side of device wafer 201a is heavily doped via phosphorus diffusion or high dose implantation, followed by deep driving, thus obtaining a deep n+ doped region 203a. Subsequent to the formation of the deep n+ doped region, back side of device wafer 201a is first coated with first layer 270a of a suitable masking material. Preferably, first masking layer 270a is fabricated from a material such as $SiO_2$ and in a thickness of 4000 Å. Back side of device wafer 201a is then coated with second layer 275a, comprising $Si_3N_4$, and preferably of a thickness of 2000 Å. A person of ordinary skill in the art would appreciate that the utilization of materials for the fabrication of first and second masking layers are not limited to $SiO_2$ or $Si_3N_4$, and can easily be changed to suit other design or operational requirements.

Once first layer 270a and second layer 275a are applied to back side of device wafer 201a, the back side is coated with a conventional photoresist mask, thus forming a window pattern on the back side of wafer 201a. The photoresist mask is formed using any of the conventional photolithographic techniques including, but not limited to, optical, UV (i.e. ultraviolet), EUV (i.e. enhanced ultraviolet) photolithography, e-beam or ion-beam lithography, x-ray lithography, interference lithography, or any other similar technique. Second layer 275a is then etched in accordance with the formed window pattern, using a dry etching (gas) process. First layer 270a acts as a stop etch layer in the dry etch process, as the process passes through $SiO_2$ at a significantly slower rate than $Si_3N_4$. First layer 270a is then etched according to the window pattern via the use of buffered $HF_3$, thereby exposing device wafer 201a, coated with deep n+ regions 203a through the pattern achieved via the use of the photoresist mask. The photoresist mask is then removed from the back side of the wafer, prior to etching the grooves in the substrate, as the wet etchant would damage the photoresist mask. As an alternative, the $Si_3N_4$ layer and pattern already formed in the previous steps functions as the etch mask.

"V"-shaped grooves are then etched into device wafer 201a and deep n+ regions 203a, through the use of a wet (chemical) etch process. It is preferable to use KOH in the chemical etch process of this step. It must be noted here that the etch rate of the silicon wafer is orientation dependent—the more slowly etched crystal planes form the side and end walls of the V-grooves. Device wafer 201a is preferably a wafer having a crystal orientation <1-0-0>. V-shaped grooves etched parallel to the <1-1-0> direction have planar facets which bind the V-shaped grooves, lying in the <1-1-1> plane. The planar facets are inclined at an angle of 54.7° with respect to the <1-0-0> plane. The groove sizes are controlled by the corresponding mask windows, the accuracy of their alignment with the crystal axes, the erosion rate of the edges of the mask, and the relative etch rates of the crystal planes. Typically, the finished widths of V-grooves can be controlled to within 0.5 to 1 µm. Manufacturing methods of 3-D microstructures, such as concave cavities or grooves, of various shapes and textures in semiconductor substrates are well known in the art. Orientation selective wet etching techniques including, but not limited to, isotropic, anisotropic etching, etc. are preferred. Like other conventional etching techniques, orientation selective wet etching techniques also utilize custom-made or conventional mask patterns. Preferably, a "V"-shaped groove pattern, formed on a suitable photographic mask in accordance with the principles of the present invention, is used to protect one area of the wafer 201a during the stripping and etching processes. The present invention, however, is directed towards providing methods of masking and etching the active area, thereby used to minimize the likelihood of crosstalk while still providing the detector with sufficient strength to avoid easy breakage. The scope and spirit of the invention is no way limited, and other 3-D microstructures may be etched into the back side of wafers in accordance to the properties of the present invention.

After "V"-shaped grooves are etched into the device wafer shallow n+ layer 202a is diffused onto the back side of device wafer 201a. The back side of device wafer 201a, including the surface of V-shaped grooves 235a, is then coated with layer 280a, an antireflective coating. Various antireflective coating designs, such as 1 layer, 2 layer, 3 layer, and 4+ layers may be employed. By way of example, and by no means limiting, the 1-layer antireflective coating design adopted herein utilizes thin film materials, such as oxides, sulfides, fluorides, nitrides, selenides, metals, among others. In one embodiment of the present invention, layer 280a comprises $SiO_2$ AR (i.e. silicon dioxide antireflective). Preferably, the $SiO_2$ AR layer has a thickness of 900 Å.

Figure 2B:
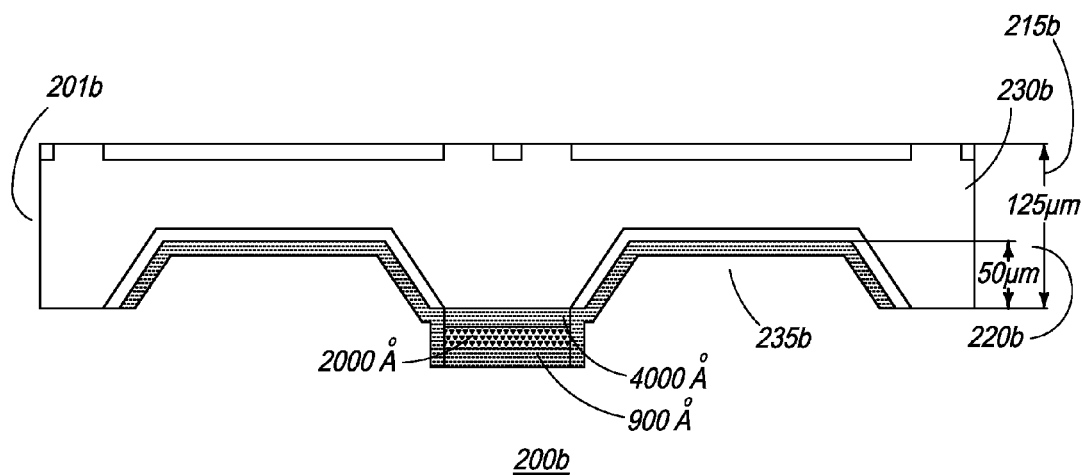
FIG. 2b is a cross sectional view of one embodiment of the back side of a back side etched, front side contact photodiode array of the present invention.

Referring now to FIG. 2b, the back side of another embodiment of the present invention is depicted. Note that the front side of photodiode array 200b has already been described above with respect to FIG. 1a. Device wafer 201b comprises three regions, including first region 215b, second region 220b, and third region 230b, with maximum, minimum, and variable thicknesses, respectively. By way of comparison with FIG. 2a, FIG. 2b depicts a cross section of photodiode array 200b without deep n+ region (shown as 203a in FIG. 2a). Third region 230b is of a varying thickness and in combination with second region 220b, constitutes "U"-shaped or "V"-shaped etchings 235b in the back side of wafer 201b. Various constructional details with respect to the three regions in photodiode array 200b have been explained with reference to FIGS. 1a and 2a and will not be discussed here. It should be noted, however, that the first manufacturing step as described with respect to FIG. 2a is omitted in the manufacture of photodiode array 200b due to the omission of the deep n+ region.

Now, referring back to FIG. 1a, the back side of yet another embodiment of the back side of the photodiode array of the present invention is depicted. Note that front side characteristics and optimal dimensions with respect to FIG. 1a have already been discussed above. Device wafer 105a may be made up of various materials, and is preferably, but not limited to Si or Ge. The crystal orientation of wafer 105a is preferably <1-0-0>. Back side of device wafer 105a is selectively etched, at appropriate positions via a suitable etching technique to form three dimensional (hereinafter, "3-D") microstructures therein, thus minimizing the active area layer and decreasing the affects of crosstalk. The grooves are preferably "U" or "V" shaped with a depth of approximately 50 µm from the back surface. The present invention may employ various other 3-D microstructures of varying shapes and dimensions including, but not limited to, grooves, pyramidal pits, pyramidal cavities etc. for minimizing active area layers. Such various other microstructures will be readily apparent to one of ordinary skill in the art having the benefit of this disclosure. The above specifications are not limiting with respect to the 3-D microstructures and their accompanying dimensions can be changed to suit any design, fabrication, and functional requirements.

For example, and by no way of limitation, a wet etching technique is used to form "V" shaped grooves on the back side of device wafer 105a, at suitable positions, such as positions 125a, as shown in FIG. 1a. Via such wet etch technique, monocrystalline wafers etch faster in certain crystallographic directions than in others, thereby allowing for certain portions of the wafer to act as a "stop" for the etch process. This involves both a selection of appropriate wafer orientation and a suitable mask pattern for the photographic mask. Optionally, reactive ion etching (RIE) may be used to form concave grooves on the back side of device wafer 105a. The grooves formed via this technique, however, form "U"-shaped grooves. The sidewalls of such grooves are more vertical, wherein the wall is angled at less than 10 degrees.

As a first manufacturing step, back side of device wafer 105a is heavily doped via phosphorus diffusion or high dose implantation, followed by deep driving to obtain a deep n+ doped region 130a. First layer 140a, of a suitable masking material, is then thermally grown onto the back side of device wafer 105a. Preferably, the first masking layer is fabricated from a material such as $SiO_2$ and in a thickness of 4700 Å. Back side of device wafer 105a is then coated with second layer 165a, comprising deposited $Si_3N_4$, and preferably of a thickness of 2000 Å. A person of ordinary skill in the art would appreciate that the utilization of materials for the fabrication of first and second masking layers are not limited to $SiO_2$ or $Si_3N_4$, and can easily be changed to suit other requirements.

Once first layer 140a and second layer 165a are applied to back side of device wafer 105a, the back side is coated with a conventional photoresist mask, thus forming a window etch pattern. The photoresist mask is formed using any of the conventional photolithographic techniques including, but not limited to, optical, UV (i.e. ultraviolet), EUV (i.e. enhanced ultraviolet) photolithography, e-beam or ion-beam lithography, x-ray lithography, interference lithography, or any other similar technique. Second layer 165a is then etched in accordance with the formed window pattern, using a dry etching (gas) process. First layer 140a acts as a stop etch layer in the dry etch process, as the process passes through $SiO_2$ at a significantly slower rate than $Si_3N_4$. First layer 140a is then etched in the window pattern via the use of buffered $HF_3$, thereby exposing device wafer 105a and deep n+ regions 130a through the window pattern achieved via the use of the photoresist mask.

The photoresist mask is then removed from the back side of the wafer, prior to etching the grooves in the substrate, as the wet etchant would damage the photoresist mask. As an alternative, the $Si_3N_4$ layer and pattern already formed in the previous steps functions as the etch mask.

"V"-shaped grooves 170a are then etched into device wafer 105a, first removing doped n+ deep regions 130a. After "V"-shaped grooves are etched into the device wafer shallow n+ layer 135a is diffused onto the back side of device wafer 105a, coating only the surface of V-shaped grooves 170a. The surface of V-shaped grooves 170a is then coated with layer 145a, an antireflective coating. Various antireflective coating designs, such as 1 layer, 2 layer, 3 layer, and 4+ layers may be employed. By way of example, and by no means limiting, the 1-layer antireflective coating design adopted herein utilizes thin film materials, such as oxides, sulfides, fluorides, nitrides, selenides, metals, among others. In one embodiment of the present invention, layer 145a comprises $SiO_2$ AR (i.e. silicon dioxide antireflective). Preferably, the $SiO_2$ AR layer has a thickness of 900 Å.

Figure 1B:
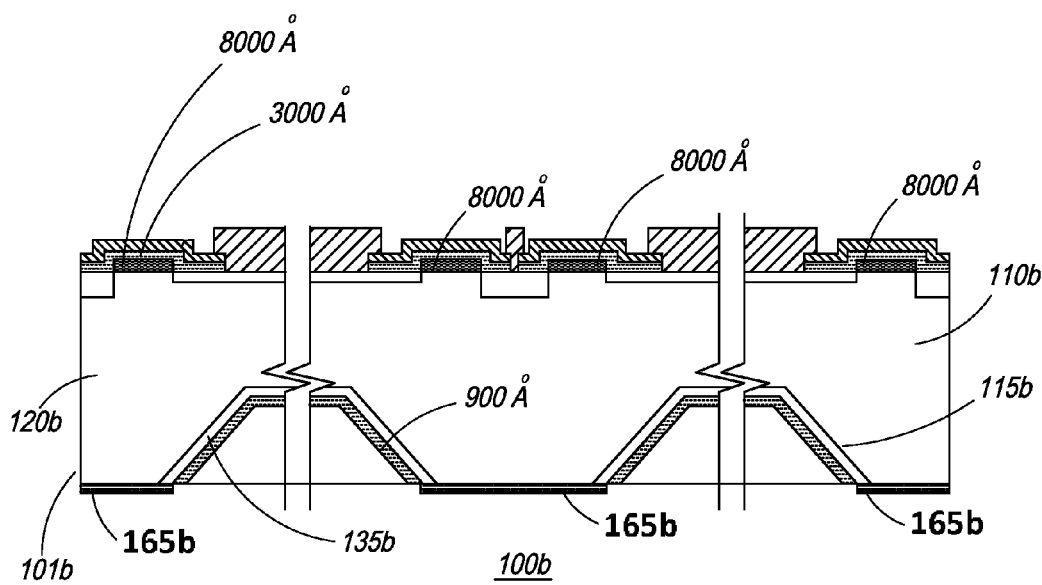
FIG. 1b is a cross sectional view of one embodiment of a back side etched, front side contact photodiode array of the present invention, also illustrating a front side of the present invention.

Referring now to FIG. 1b, a second embodiment of a photodiode array 100b is depicted. Photodiode array 100b comprises first region 110b, second region 115b, and third region 120b, dimensional details of which are discussed above with reference to FIG. 1a. In addition, the doping materials used, masking layers formed, and etching techniques adopted to form the 3-D microstructures have already been explained above with reference to FIG. 1a. In the manufacture of photodiode array 100b, however, only a single first masking layer is applied to the back side of the photodiode array. For example, and by no way of limitation, the single masking layer 165b is preferably $Si_3N_4$ and of a thickness of 4000 Å. In addition, second region 115b comprises only a shallow n+ region 135b.

Figure 3:
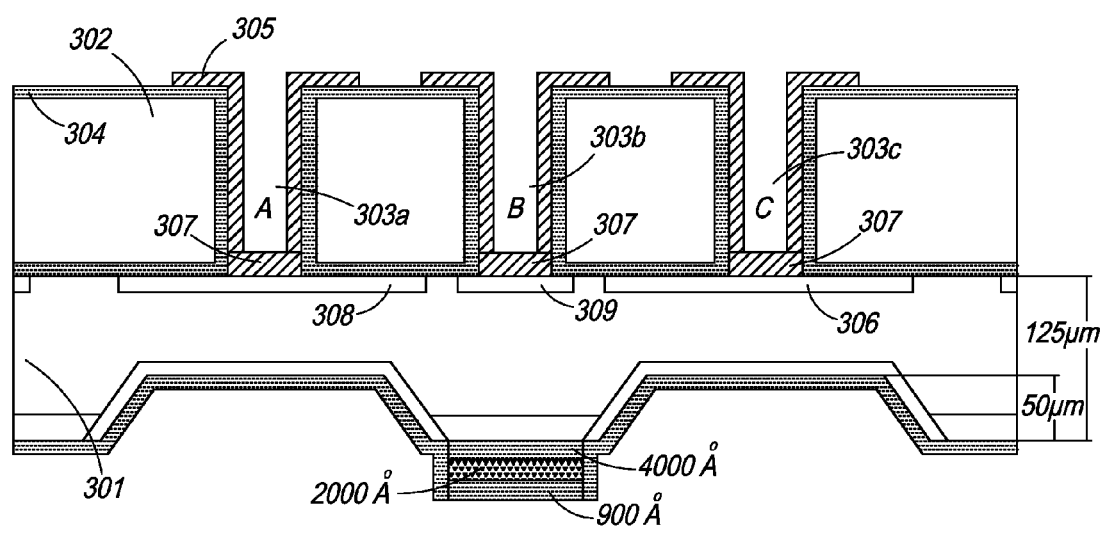
FIG. 3 depicts a back side illuminated, front side contact photodiode array of the present invention, further comprising a handle wafer, for improved strength and manageability.

Referring to FIG. 3, another embodiment of the photodiode array of the present invention is illustrated. The back side illuminated, front side contact (BSL-FSC) photodiodes are implemented in an array and have superior performance characteristics, including low dark current (current leakage), very high shunt resistance, less crosstalk, and less radiation damage due to a thinner active area. To improve strength and manageability, the photodiode as shown in FIG. 3 further comprises a handle wafer. The front surface cathode and anode contacts are brought to the surface of the handle wafer through the metallization of channels connecting a p+ metal pad to the p+ region and an n+ metal pad to the n+ region. The starting material for photodiode array 300 is device wafer 301 with handle wafer 302 bonded to the front surface of device wafer 301.

Handle wafer 302 has channels 303a, 303b, and 303c (hereinafter referred to collectively as "303") formed in handle wafer 302 at three positions, for example and by no means limiting, those marked "A", "B", and "C". Starting precisely from the top surface of handle wafer 302, channels 303 extend through the total depth of handle wafer 302 to the front side of the device wafer 301. The side walls of the handle wafer 302 define channels 303. Handle wafer 302 is coated with a first layer 304 and a second layer 305, both forming top and sidewalls of handle wafer 302. First oxide insulation layer 304 coats the inner walls of channels 303. For example, but not limited to such example, $SiO_2$ may be used for the first oxide insulation layer 304. Second layer 305, layered on top of first layer 304, coats a major portion of the inner walls forming channels 303 and at least partially covering the top surface of handle wafer 302. Second layer 305, a heavily doped pad layer of a selected conductivity type, in conjunction with layer 304 coats inner walls which form channels 303. Preferably, second layer 305 is either p+ doped or n+ doped. Second layer 305 in channel 303 at area "B" uses a n+ doped pad wherein p+ doped pads are used at areas "A" and "C".

Channels 303, having first layer 304 and second layer 305 coating side walls of handle wafer 302 and forming inner walls of channel 303, are vertically aligned with respect to layers 306, 308, and 309. Further second layer 305 (vertical p+ pad in this embodiment) in channels 303 comprising areas "A" and "C" covers a large portion, preferably a substantial portion of the depth of channel 303 (or the portion that substantially forms the depth of handle wafer 302). Bottom layers 306 and 308 are in electrical communication with horizontal p+ pads 307 as depicted in the cross-sectional view of FIG. 3. In channel 303 comprising area "B", horizontal n+ pad 307 is electrically connected to n+ region 309.

Areas between second layers 305 (either p+ or n+), running along the sidewalls of handle wafer 302 and forming channels 303, can be described as void areas "A", "B", and "C". Due to metallization of channels 303 along the entire periphery of the vertical sidewall layer 305 and the horizontal pads 307 therein, the front surface cathode and anode contacts on device wafer 301 are brought to the surface of the handle wafer 302 with channels 303 connecting the p+ metal pads to the p+ regions and the n+ metal pads to the n+ regions.

The back side of device wafer 301, as shown in FIG. 3, has already been described in one embodiment with respect to FIG. 2a. The description as offered in FIG. 2a is herein incorporated by reference.

Various other methods of physically separating active regions of photodiode arrays may be readily apparent to a person of ordinary skill in the art. It should be noted that the above description about separation of active regions of individual photodiodes, via formation of insulation layers there between, is merely for illustrative purposes and not intended to limit the applicability of the present invention.

Figure 4A:
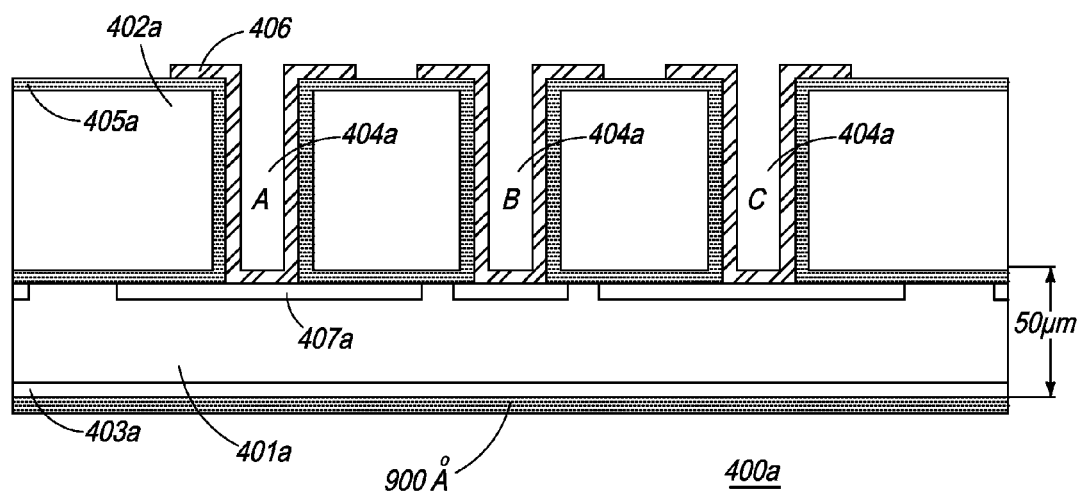
FIG. 4a depicts a back side illuminated, front side contact photodiode array of the present invention, further comprising a handle wafer.
Figure 4B:
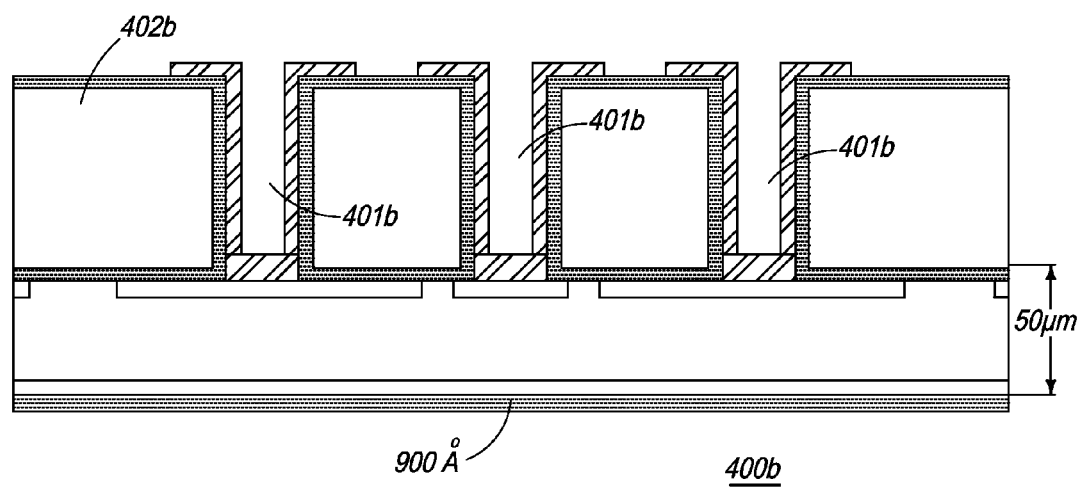
FIG. 4b depicts a back side illuminated, front side contact photodiode array of the present invention, further comprising a handle wafer.

Referring now to FIGS. 4a and 4b, additional embodiments of the back side illuminated-front side contact photodiode arrays are shown. The BSL-FSC photodiodes have thin active layers, thereby improving crosstalk characteristics and reducing susceptibility to radiation damage. A plurality of p+ and n+ regions are separated by a shallow active region. To improve strength and manageability, the photodiode further comprises a handle wafer. The front surface cathode and anode contacts are brought to the surface of the handle wafer through the metallization of channels connecting a p+ metal pad to the p+ region and an n+ metal pad to the n+ region.

Referring now to FIG. 4a, a cross sectional view of one embodiment of the present invention is shown. As an example, and by no way of limitation, silicon may be utilized in accordance with the principles of the present invention. The starting material for the BSL-FSC photodiode is a silicon wafer comprising a device wafer 401a bonded to a handle wafer 402a using a suitable bonding material via an appropriate method of bonding silicon wafers. Such bonding methods are well known to one of ordinary skill in the art. Both device wafer 401a and handle wafer 402a are preferably formed of the same semiconductor material of a selected conductivity type, such as p-type or n-type. The device wafer 401a preferably has a thickness of approximately 50 µm.

Handle wafer 402a increases strength in the BSL-FSC photodiode while improving manageability. The front surface cathode and anode contacts are brought to the top surface of the handle wafer 402a through the metallization of channels 404a connecting a p+ pad to the p+ region and a n+ pad to the n+ region. Channels 404a, formed in handle wafer 402a are marked with area designations "A", "B", and "C". The inner side walls of handle wafer 402 forming channels 404a comprise first layer 405a, which is an oxide insulation layer and second layer 406a, which is a contact layer for handle wafer 402a. Material selection and manufacturing method for such layers have already been described with reference to FIG. 3 and will not be described in detail here.

As shown in FIG. 4a, boron doped polysilicon is preferably used as the material for second layer 406a, and define defining channel areas "A" and "C", in conjunction with first layer 405a and bottom wall 407a. A person of ordinary skill in the art would readily appreciate that the selection and utilization of material for the second sidewall layer is not limited to boron doped polysilicon and can be changed to suit varied technical and operational specifications. Second sidewall layer 406a defining channel area "B" preferably comprises, but is not limited to phosphorus doped polysilicon.

Also depicted in FIG. 4a is a plurality of selected p+ and n+ doped regions separated from a substantially uniform shallow n+ layer 403a by a thin active region. Portions of the thin active region or layer are also juxtaposed between the plurality of p+ and n+ regions. The shallow n+ layer 403a improves the quantum efficiency at shorter wavelengths and reduces dark current (current leakage) of the photodiode.

Referring now to FIG. 4b, a cross sectional view 400b of another embodiment of the BSL-FSC photodiode is shown. The specifications of the BSL-FSC photodiode are described above with respect to cross section 400a of FIG. 4a. In contrast, however, FIG. 4b employs p+ metal pad layers and n+ metal pad layers as the sidewalls that define channels 401b. FIG. 4b shows front surface cathode and anode contacts, brought to the surface of handle wafer 402b through the metallization of channels 401b connecting a p+ metal pad to the p+ region and an n+ metal pad to the n+ region.

Figure 5A:
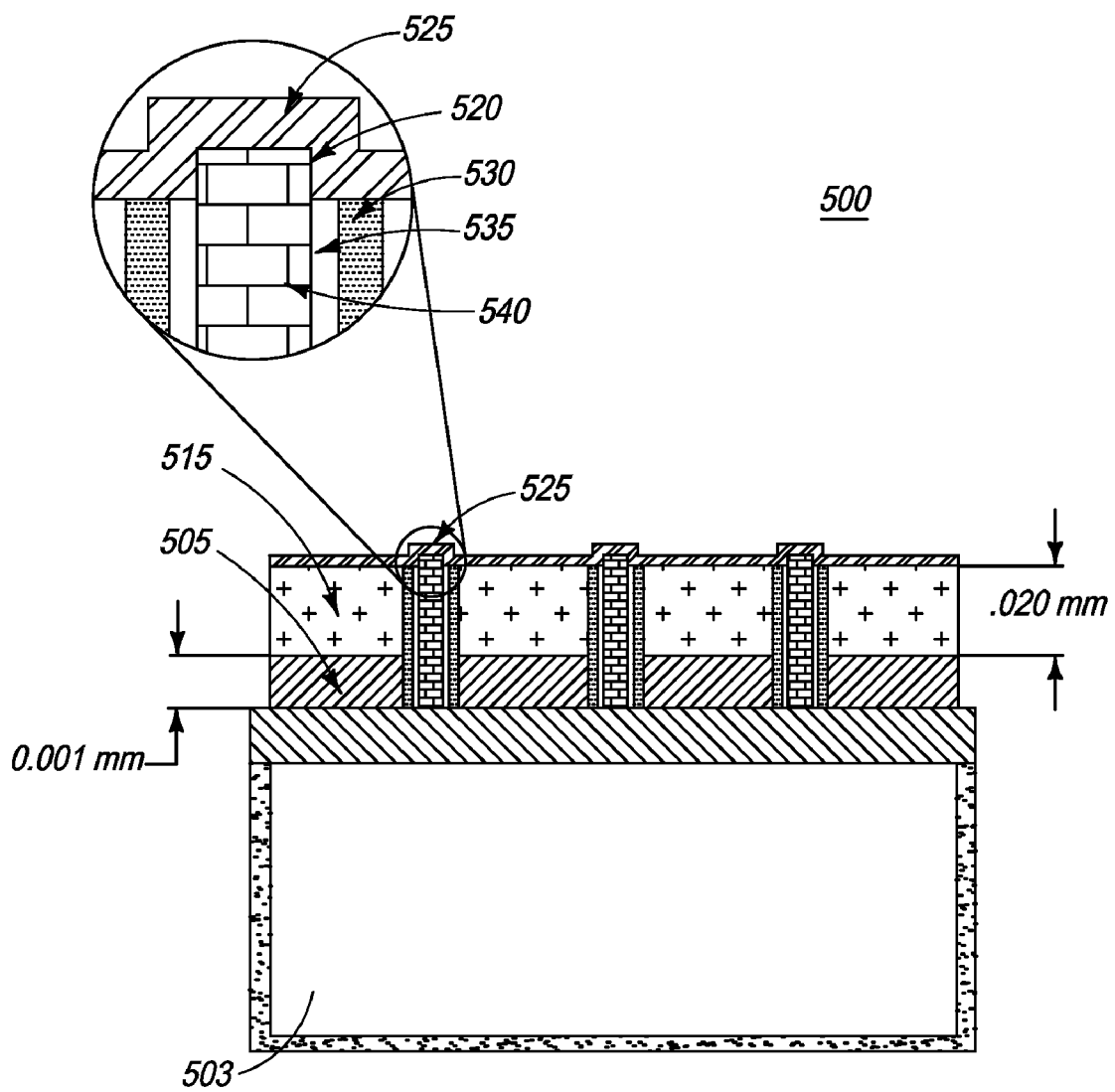
FIGS. 5a, 5b, and 5c depict different views of an array of photodiodes with a plurality of trenches functioning as isolation trenches, to non-conductively isolate electrically active regions from each other.
Figure 5B:
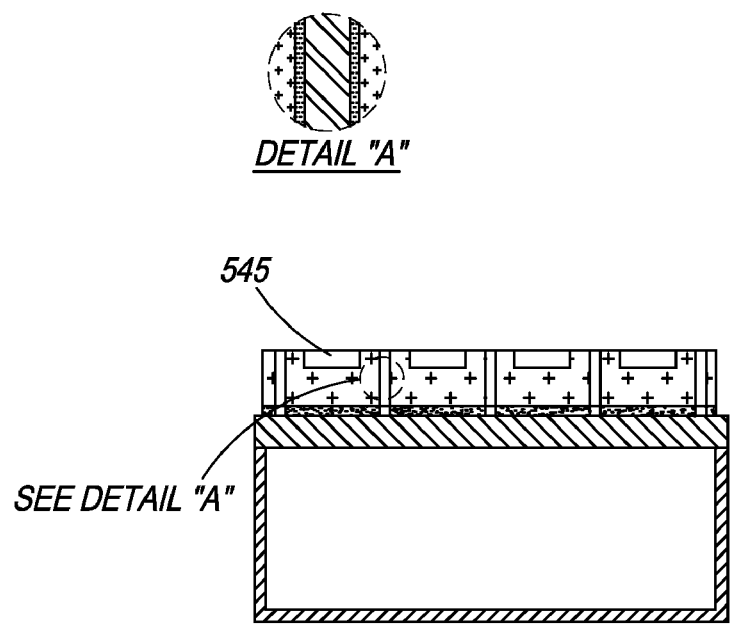
Figure 5C:
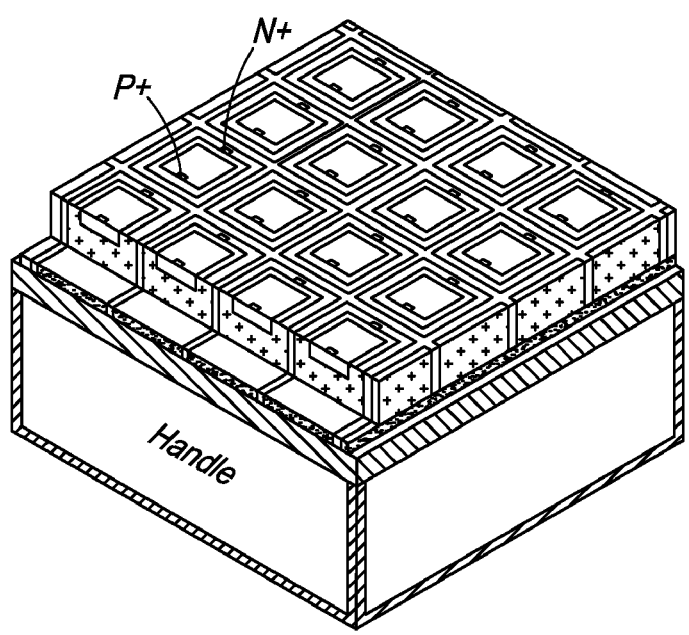

In another embodiment, the present invention comprises a front side illuminated photodiode array with zero crosstalk due to dielectric isolation. The front side illuminated, zero crosstalk (BSL-ZC) photodiodes are implemented in an array and have superior performance characteristics, including less radiation damage due to a thinner active area and zero crosstalk due to a complete isolation of the carrier regions. FIGS. 5a, 5b, and 5c depict different views of an array of photodiodes with a plurality of trenches functioning as isolation trenches, to non-conductively isolate electrically active regions from each other.

Specifically, FIG. 5a depicts one such exemplary trench, functioning as an isolation trench. A device layer 515 is in physical communication with a trench defined by a doped trench sidewall 530, a trench sidewall liner 535, preferably an oxide, and polysilicon 540 as a filler. The trench is further defined by a polysilicon step 520, preferably having a height at or around 300 nm, and a TEOS trench endpoint 525, preferably having a height at or around 500 nm. In one embodiment, the trench has a width at or around 2.5 µm to 4 mu. In the above-mentioned embodiment, various specifications for device wafer thicknesses and trench widths are provided. The provided specifications are not limiting with respect to device wafer thicknesses and trench widths and their accompanying dimensions can be changed to suit any design, fabrication, and functional requirements.

Trench sidewall 530 is of n-type (phosphorous) doping, if the device layer material is also n-type. The doping type of the trench sidewall layer matches that of the device layer. Sheet resistance of the trench sidewall doping is less than 50 ohm per square. The trench sidewall liner thickness, for each sidewall, is 150 nm+/−35 nm. The polysilicon 540 filled trench isolated photodiode array 500 eliminates electrical migration between the adjacent detecting regions therein, thereby preventing minority carrier leakage current and achieving zero crosstalk characteristics.

Custom silicon-on-insulator (SOI) starting material for photodiode array 500 of the present invention is a device layer 515 with a buried layer 505 formed on top of a buried oxide (BOX) layer, resting on a handle wafer 503. Handle wafer 503 can be of any type as is well known to those of ordinary skill in the art, ranging from handle wafers of low resistivity to handle wafers of high resistivity. Additionally, low cost handle wafers may be employed. Also, handle wafers of optimal performance can be used. Handle wafer 503 is doped with an impurity of a selected conductivity type, either n-type or p-type and preferably has a thickness of approximately 300-700 µm.

Handle wafer 503 is oxidized, thereby forming a buried oxide layer surrounding the handle wafer. Device layer 515 is preferably a double-sided polished wafer (to improve bonding characteristics) and is subjected to shallow n+ diffusion or ion implantation, thereby forming layer 505 on the back side of device layer 515. The front side of handle wafer 503, covered with the oxide layer, is then bonded to the backside of device layer 515, which has an original thickness of 400 µm. The BOX layer is used for the bonding process.

Device layer 515 is preferably formed of the same semiconductor material as handle wafer 503 and is ground and polished to a thickness of 20 µm. It is ground and polished to such desired thickness. Optionally, device layer 515 may be grown as an epitaxial layer on top of handle wafer 503. The positioning of the trenches is then formed using a standard photolithography step, as mentioned above, thereby obtaining a pattern on the thinned wafer. Using the photoresist pattern, a dry etching technique, such as reactive ion etching is then used to etch the silicon wafer for trench formation. The photoresist layer is removed following the step of silicon trench etching.

Trench sidewall 530 is deposited via, but not limited to, a thermal deposition technique. The sidewall oxide layer 535 is then formed along the vertical wall of the trench. The wafers are then subjected to polysilicon deposition, thereby filling the trenches with polysilicon. It is preferred that the trenches in this embodiment of the present invention are filled after the growth of trench sidewall liner 535, so that the polysilicon 540 filler is more likely to be void free. In the final step, a TEOS oxide layer is deposited on the surface.

Referring now to FIGS. 5b and 5c, an array of photodiodes affixed to a handle wafer 503 with a layer of buried oxide therebetween is shown. Note that photodiode array 500 is front side illuminated because the presence of the buried oxide layer will act as an impenetrable barrier to a light generated carrier. Each photodiode has surface n+ and surface p+ regions separated from a base n+ region by an active layer and are separated from adjacent photodiodes by a trench acting as an isolating layer. Spaced semiconductor regions 545 are formed in device layer 515 via standard semiconductor processing, masking and etching techniques, as are well known to those of ordinary skill in the art. A boundary between the device layer wafer 515 and each spaced region 545 defines a p-n junction (not shown).

Of particular advantage, the present invention provides a method for filling an isolation trench or other semiconductor structure whose active areas require a non-conductive material, typically but not limited to undoped $SiO_2$, to physically and non-conductively isolate said electrically active regions.

Figure 6:
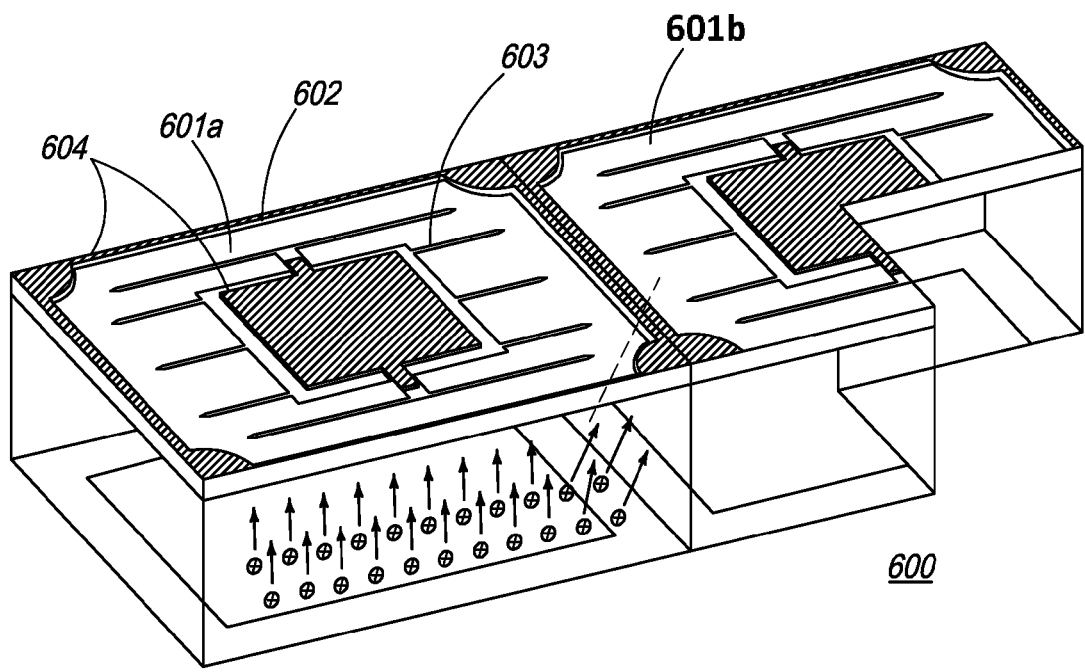
FIG. 6 depicts a portion of a conventional three-dimensional (3-D) photodiode array with a p+ fishbone structure.

FIG. 6 depicts a portion of a conventional three-dimensional (3-D) photodiode array 600 with a p+ fishbone structure. While the fishbone design structure allows for low capacitance (typically 7 pF at low voltage), the resultant crosstalk is high because a) the gap between the two adjacent bones is wide and b) there is no periphery frame bone. As can be seen in FIG. 6, some of the carriers generated near the edge of the backside of the photodiode can stray to the adjacent pixel and get collected there, thus creating crosstalk. Photodiode array 600 comprises a plurality of photodiode elements.

Now referring to FIG. 6, exemplary left and right diode elements 601a and 601b, respectively, are described in further detail. The top surface of photodiode array 600 comprises several layers, including first layer 602, second layer 603, and third layer 604. It should be noted that the corresponding layers exist in each diode element of photodiode array 600 but will only be described with respect to diode element 601a hereinafter. From a design standpoint the dimensions of the silicon wafer, the number of diode elements forming the matrix array, the number of regions, and the number of regions comprising the photodiode array may vary and are merely illustrative of a conventional photodiode array.

First layer 602 is a diffused region and is heavily doped with a suitable impurity or dopant of a selected conductivity type, such as p-type or n-type. Preferably, but not limited to such example, diffused layer 602 is heavily doped with a suitable impurity of n-type conductivity. An appropriate n+dopant is employed for the n+ diffusion process, and includes a suitable source, such as a gas, liquid, or solid. Many approaches for carrying out the diffusion process are well known to those of skill in the art and the intricacies of such approaches will not be discussed in detail here. The choice of diffusion method is dependent on various factors, such as the diffusion coefficient of the dopant, permissible error in diffusion depth, and diffusion source.

Second layer 603 is a diffused region and is heavily doped with a suitable impurity or dopant of a selected conductivity type, such as p-type or n-type. Preferably, but not limited to such example, diffused layer 603 is heavily doped with a suitable impurity of p-type conductivity. An appropriate p+ dopant is employed for the p+ diffusion process, and includes a suitable source, such as a gas, liquid, or solid. Many approaches for carrying out the diffusion process are well known to those of skill in the art and the intricacies of such approaches will not be discussed in detail here.

The choice of diffusion method is dependent on various factors, such as the diffusion coefficient of the dopant, permissible error in diffusion depth, and diffusion source. For example, and not limited to such example, the p+ dopant employed herein is boron (i.e. B) in accordance with the principles of the present invention. P+ diffused layer 603 serves as an area where the photodiode junction is active and can convert photons thereby generating current.

The p+ fishbone mask is preferably applied to the front side the wafer, as described in further detail with the manufacturing steps below. Briefly, the front side of the wafer is preferably first coated with a $SiO_2$ layer and subsequently subjected to selective etching, using the p+ fishbone mask to ensure certain regions retain the $SiO_2$ layer while others remain devoid of it.

Third region 604 comprises an appropriate metal. For example, but not limited to such example, in high density packaging, as with the photodiode array of the present invention, a metal system such as, but not limited to Al/Ni/Au, Ni/Cr/Au, or Ti/Pd/Ag. Other metal systems may be employed as well. In other cases, such as when the anodes and cathodes are connected to PCB/ceramic substrate via wire bonding, aluminum can be used as metallization traces and pads.

While the conventional photodiode array with a p+ fishbone structure described above with respect to FIG. 6 allows for low capacitance, the resultant crosstalk is high. As can be seen in FIG. 6, some of the carriers generated near the edge of the backside of the photodiode can stray to the adjacent pixel and get collected there, thus resulting in crosstalk.

Figure 7A:
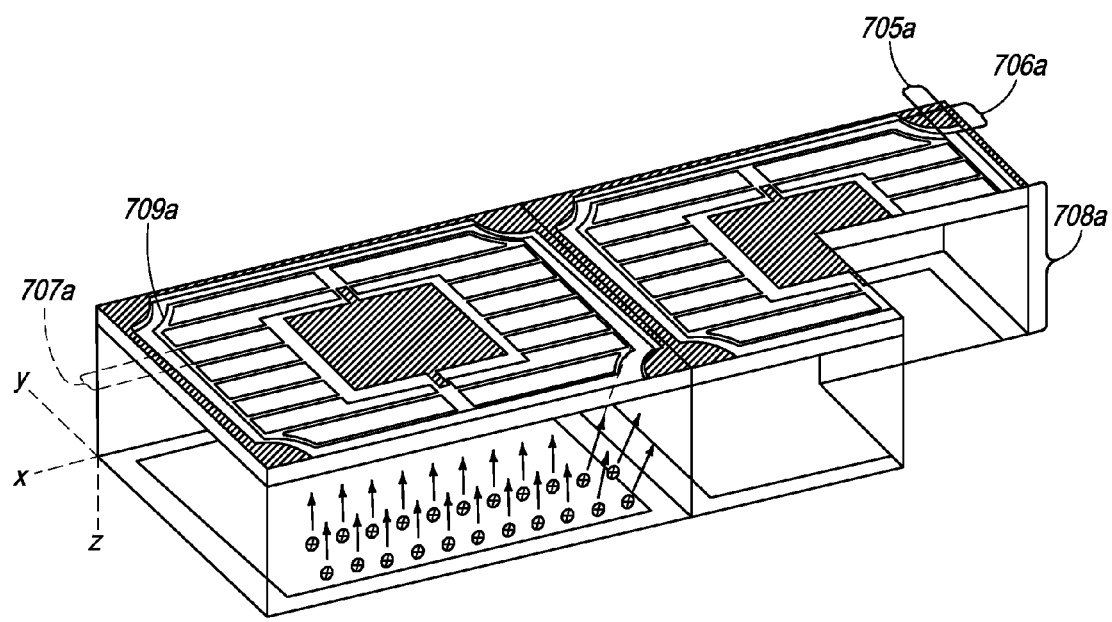
FIGS. 7a, 7b, and 7c illustrate the photodiode arrays of the present invention, having p+ fishbone structures on the front side, wherein the gap between the bones is respectively smaller than of those shown in FIG. 6.
Figure 7B:
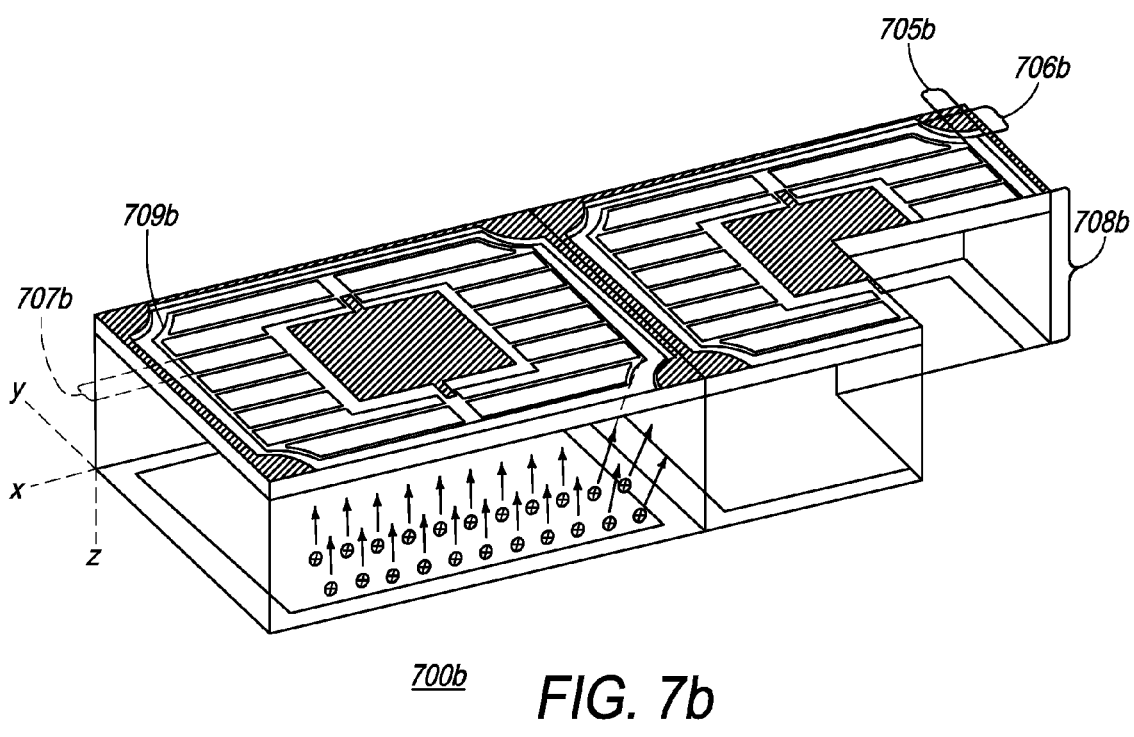
Figure 7C:
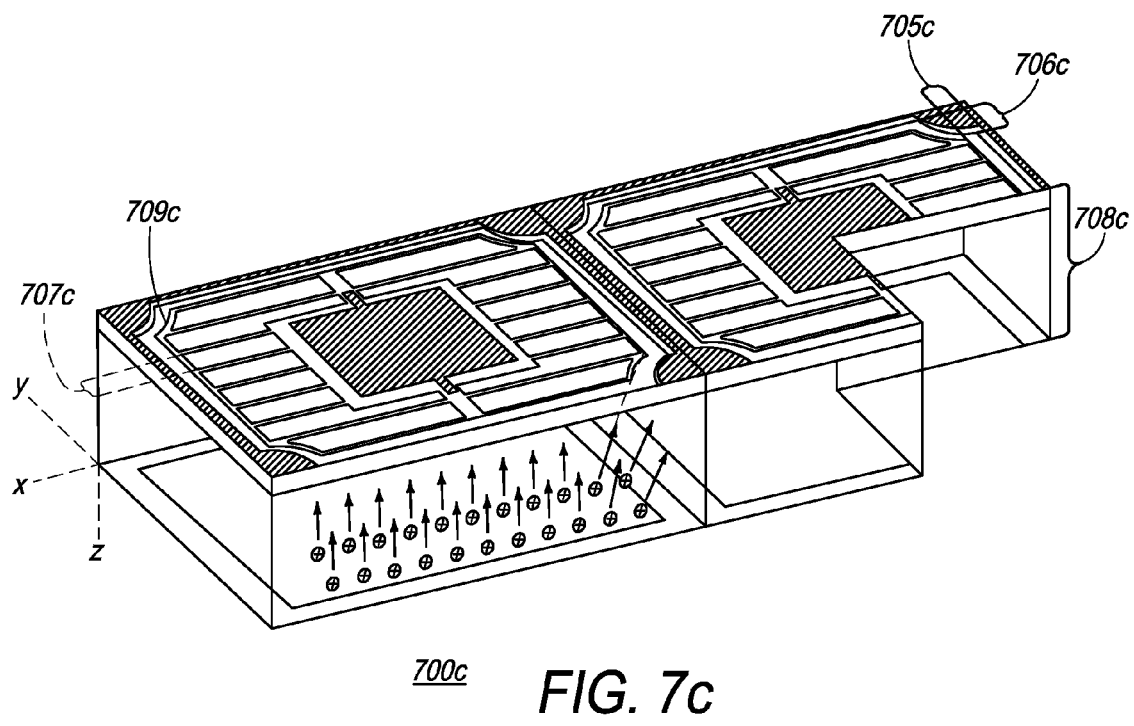
Figure 8A:
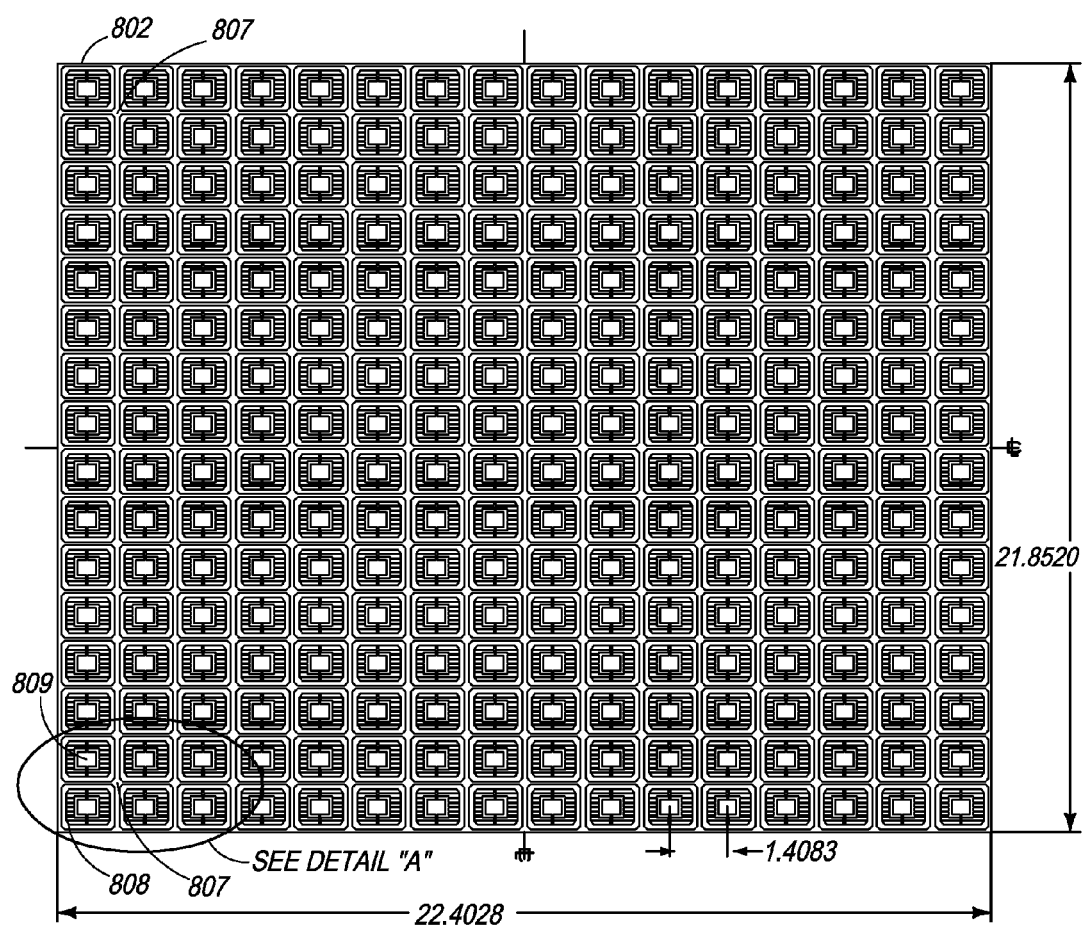
FIG. 8a depicts a top view of the photodiode array of the present invention.
Figure 8B:
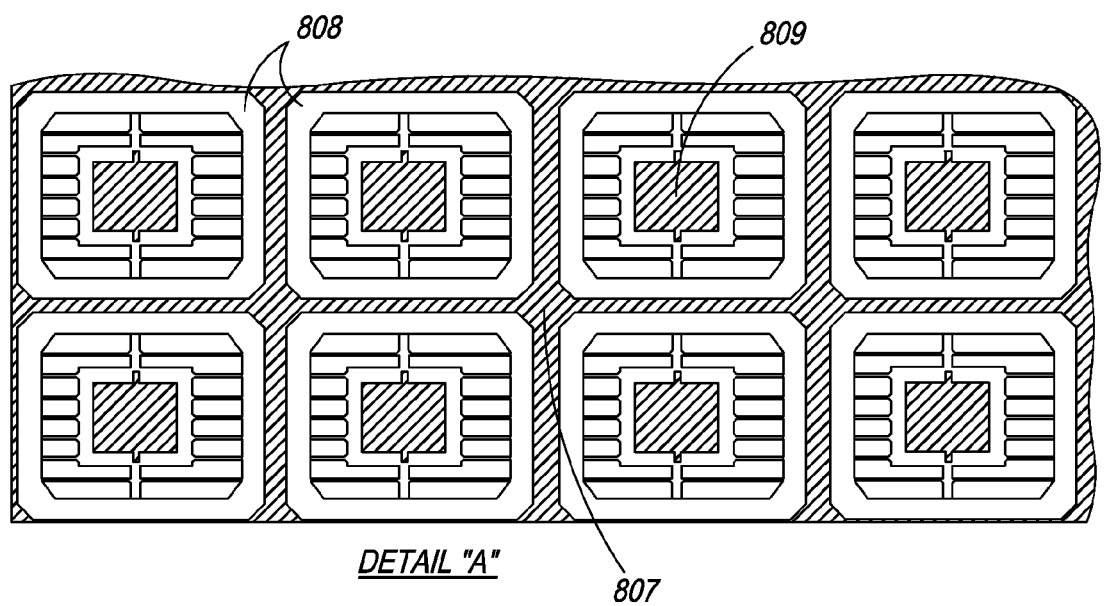
Figure 8B:
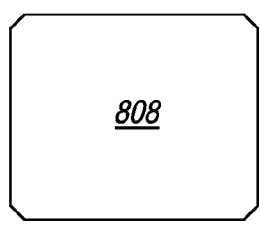

In one embodiment, as shown in FIGS. 7-9, the present invention is directed towards a front-side contact back side illuminated (FSC-BSL) photodiode with a special fishbone structure to reduce both capacitance and crosstalk. Unlike conventional devices, the present invention discloses both the use of a narrower gap between adjacent bones and a periphery frame bone. Typically, carriers that are photo-generated further from the p-n junction can diffuse to the p+ diffused "bones" and be collected by the depletion region. Thus, conventional fishbone structures can be employed when devices are made on a substantially high minority carrier lifetime silicon material. In addition, in an embodiment of the present invention, cathode and anode contacts are on the front side of the wafer.

In an embodiment of the present invention, as described in further detail with respect to FIGS. 7a, 7b, and 7c, the p+ fishbone has the following variable characteristics, assuming an x-y-z axis as drawn near photodiode 700 wherein the x-axis represents the length of the wafer, the y-axis represents the width of the wafer, and the z-axis represents the height of the wafer: p+ to n+ separation in the x-direction, 705a, 705b, 705c; p+ to n+ separation in a y-direction 706a, 706b, 706c; the width between two contiguous p+ fishbone ribs 707a, 707b, 707c, also in the y-direction; and wafer height 708a, 708b, 708c in the z-direction.

The photodiode array of the present invention, as shown in FIGS. 7a, 7b, and 7c, are p+ fishbone structure photodiodes wherein the gap between the p+ bones is preferably in a range of 100 μm to 180 μm, thus improving the probability that the carriers will get collected by the depletion region of at least one of the bones. In addition, there is a periphery frame bone; thus, carriers generated near the edge on the backside will more likely be collected by the depletion region of the frame bone. The effects of crosstalk are reduced since fewer carriers are collected by the fishbone of the adjacent diode element. The gaps between the p+ frame and the top n+ cathode are shown as 25 μm in FIG. 7a, 50 μm in FIG. 7b, and 75 μm in FIG. 7c. The smaller the gap (between p+ and n+), the lower the crosstalk at the expense of capacitance and wafer processing yield.

In one embodiment, as shown in FIG. 7a, photodiode array 700a may have the following variable characteristics, assuming an x-y-z axis as drawn near photodiode 700a wherein the x-axis represents the length of the wafer, the y-axis represents the width of the wafer, and the z-axis represents the height of the wafer: p+ to n+ separation 705a in the x-direction of 0.025 mm; p+ to n+ separation 706a in a y-direction of 0.025 mm; the width between two contiguous p+ fishbone ribs 707a, also in a y-direction, of 0.109 mm; and wafer height 708a in a z-direction of approximately 0.125 mm. Also shown in FIG. 7a is periphery frame bone 709a, which surrounds the fishbone rib structure.

In a second embodiment, as shown in FIG. 7b, photodiode array 700b may have the following variable characteristics, assuming an x-y-z axis as drawn near photodiode 700b wherein the x-axis represents the length of the wafer, the y-axis represents the width of the wafer, and the z-axis represents the height of the wafer: p+ to n+ separation 705b in the x-direction of 0.050 mm; p+ to n+ separation 706b in a y-direction of 0.050 mm; the width between two contiguous p+ fishbone ribs 707b, also in a y-direction, of 0.109 mm; and wafer height 708b in a z-direction of approximately 0.125 mm. Also shown in FIG. 7b is periphery frame bone 709b, which surrounds the fishbone rib structure.

In a third embodiment, as shown in FIG. 7c, photodiode array 700c may have the following variable characteristics, assuming an x-y-z axis as drawn near photodiode 700c wherein the x-axis represents the length of the wafer, the y-axis represents the width of the wafer, and the z-axis represents the height of the wafer: p+ to n+ separation 705c in the x-direction of 0.075 mm; p+ to n+ separation 706c in a y-direction of 0.075 mm; the width between two contiguous p+ fishbone ribs 707c, also in a y-direction, of 0.109 mm; and wafer height 708c in a z-direction of approximately 0.125 mm. Also shown in FIG. 7c is periphery frame bone 709c, which surrounds the fishbone rib structure.

FIG. 8a depicts a top view of the photodiode array 800 of the present invention. Each square box represents diode elements 802 within photodiode array 800. In one embodiment, photodiode array 800 is arranged in the form of a 16 by 16 matrix with a total of 256 diode elements 802 on a silicon wafer starting material (not visible and described in greater detail below with reference to manufacturing process). Although an array of 256 diode elements 802 is illustrated in FIG. 8a, it is to be understood that an array or matrix of diode elements falling within the scope of the present invention may have any number of diode elements. A person of ordinary skill in the art would appreciate that the number of photodiodes incorporated in the silicon wafer is not limited to the above-mentioned number and can be adjusted to suit varied operational specifications.

The determination and/or selection of proper active area specifications include, but are not limited to, geometry; dimensions; response speed; quantum efficiency at the wavelength of interest; response linearity; spatial uniformity of response; and dark noise or other noise sources that impact photodiode sensitivity of the active area. In addition, the light sensing properties and specification of the photodiodes, such as, but not limited to, sensitivity, are largely related to the size and dimensions of the active area, not its shape or geometry. For example, the leakage current of the photodiode is proportional to its active area.

Within photodiode array 800, active areas 808 of diode elements 802 provide surfaces onto which light impinges. Active areas 808 may be designed and fabricated using standard technology. For example, and by no way of limitation, active area photolithography may be employed to design and fabricate active areas 808 possessing specifications in conformity of the principles of the present invention. In general, active area specifications, such as but not limited to size, shape and geometry may vary and are determined in accordance with the principles of the present invention. Generally, the size of the active area also has an effect on the linearity of the responsivity of a photodiode. Comparative studies involving photodiodes reveal that linearity is better in photodiodes having relatively small rather than large active areas.

In general, conventional detectors have either round or square-shaped active area geometry. There is no shape restriction, however, and many applications may require, but are not limited to triangular, radial, or trapezoidal active areas. Since photodiodes are typically manufactured via standard wafer fabrication techniques involving methods of masking and photoetching, a unique geometry depending on the requirements and specifications is relatively simple to create. The geometry size and shape can be held to a tolerance of 2 microns.

A majority of conventional, modern, semi-conducting chips include a dense array of narrow, thin-film metallic conductors, more commonly referred to as interconnects, that serve to transport current between the various devices on the chip. As integrated circuits increase in complexity, the individual components that comprise the integrated circuits must become increasingly more reliable. Due to the miniaturization of very large-scale integrated circuits, however, thin-film metallic interconnects are subject to increasingly high current densities. Under these conditions, electro-migration can lead to electrical failure of interconnects in relatively short lifetimes, thus reducing the current lifetime to an unacceptable level. Electro-migration is the result of momentum transfer from electrons, which move in the applied electric field, to the ions which make up the lattice of the interconnect material.

Thus, it is also of great importance to control electro-migration failure in thin-film interconnects. Because thin-film interconnects in integrated circuits are deposited onto large efficient single crystal silicon heat sinks, they can sustain current densities up to 1010 A/cm$^2$ without immediate damage.

In narrow interconnects, electro-migration presents several different sources of failure. The two most common are void failures along the length of the line (called internal failures) and diffusive displacements at the terminals of the line that destroy electrical contacts. Both of these failures have been attributed to the microstructure of the line and can thus be delayed or overcome by metallurgical changes that alter the microstructure.

Now referring back to FIG. 8a, wire interconnects 810 (not shown) between diode elements 802 are made through back surface contacts (not shown) located in approximate vertical alignment with central areas. Wire interconnects 810 are made at the back of photodiode array 800 and are preferably minimized. Wire interconnects 810 are also made available for creating electrical connections with external circuits, such as printed circuit boards (PCBs) and other devices.

Each of the four corners of the photodiode array 800 on the silicon wafer (not visibly shown, but understood to be the base of the photodiode array) comprises a set of four diode elements 802 and a common top cathode pad 807. FIG. 8b depicts an enlarged view of a portion of photodiode array 800, demarcated as portion "A" in FIG. 8a and outlined with a circle. In the enlarged view, as shown in FIG. 8b, an exemplary corner of the photodiode array 800 is shown, with four diode elements 802, top cathode pad 807 in the center of the four photodiode elements 802, and anode metal pad 809 in the center of each photodiode element 802. Although only four top cathode pads 807 in a 16×16 matrix photodiode array are shown it is understood that a typical array may have additional top cathode pads at a plurality of positions in various other arrangements, other than those detailed herein. Central top cathode rings create N+N high-low junctions, and thus assist in the reduction of cross talk between individual diode elements 802.

Typically, photodiode arrays may be formed as one- or two-dimensional arrays of aligned photodiodes, or, for optical shaft encoders, a semicircular arrangement of diodes. In similar situations, where possible arrangements of photodiodes include, but are not limited to, one-dimensional, circular, and semicircular types, the total number of central top cathode elements may vary depending upon design parameters.

Now referring to FIGS. 9a-9g, a manufacturing process 900 of the photodiode array of the present invention is described. In an embodiment of the manufacturing process of the above-described photodiode array of the present invention, a p+ fishbone mask is applied on the front side of the device wafer. A plurality of n+ and p+-doped regions are separated from a substantially uniform n+ layer by an active region.

The starting material for the back side illuminated, front-side contact photodiode (BSL-FSC) is a device wafer 900 preferably comprised of silicon. In one embodiment, the silicon device wafer 900 preferably has a thickness ranging from 0.075 mm to 0.275 mm. Device wafer 900 may be made up of various materials, such as, but not limited, to silicon or germanium. The crystal orientation of wafer 900 is preferably <1-0-0>. The front side of the silicon wafer is coated with a SiO$_2$ layer and subjected to selective etching, utilizing the p+ fishbone mask to ensure certain regions retain the SiO$_2$ layer while others remain devoid of it.

A photographic mask having the desired fishbone pattern, as described with reference to FIGS. 7a, 7b, and 7c above, but not limited to such configurations is produced. In general, photomasks are high precision plates containing microscopic images of electronic circuits. Conventionally, they are formed from flat pieces of quartz or glass with an etched layer of chrome on one side. The etched chrome comprises a portion of the electronic circuit design and is also referred to as the geometry of the mask. In addition, fishbone patterns or grids have a tightly coupled architecture, thus facilitating a better geometry for a sensor array. The dies are arranged in rows and columns on the mask.

Appropriate patterns and masking techniques may be employed in accordance with the principles of the present invention without departing from the spirit and scope of the invention and are not limited to the examples describe herein.

Figure 9A:
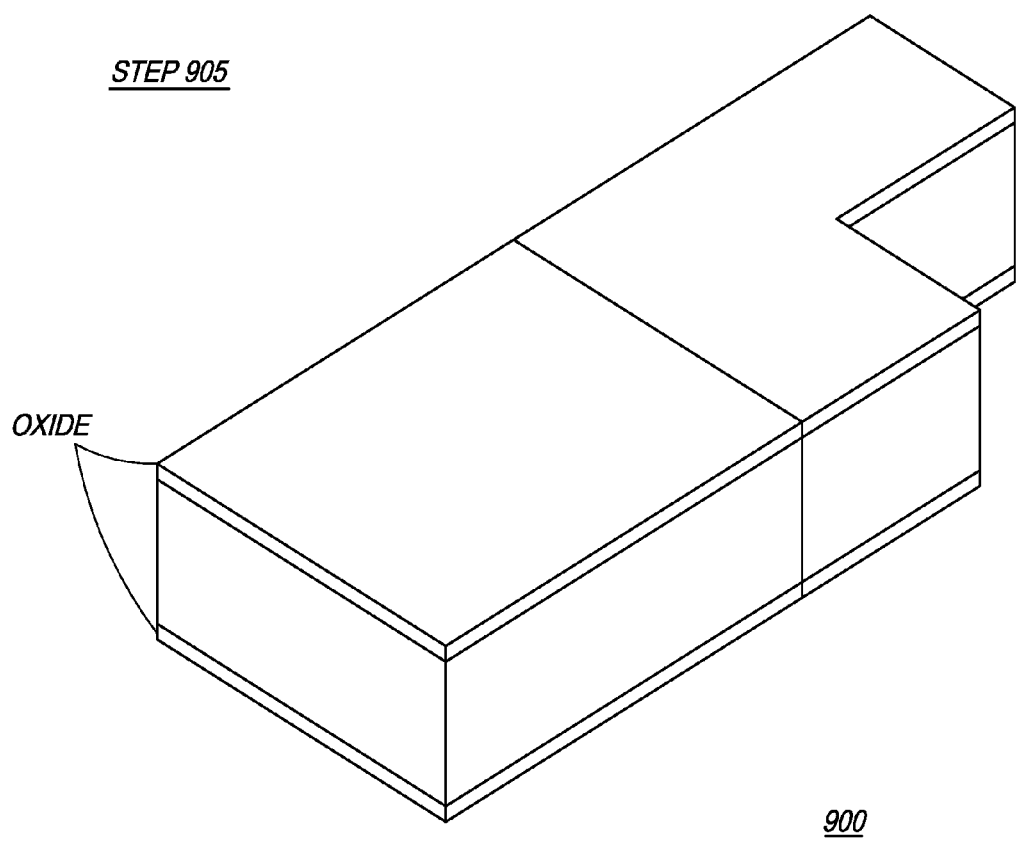
FIGS. 9a-9g illustrate steps in a manufacturing process of the photodiode array of the present invention, in which p+ fishbone masking is employed.

In step 905, as shown in FIG. 9a, an n-type silicon wafer 900 is subjected to mask oxidation. Typically, the mask oxidation step is achieved via thermal oxidation of the starting silicon wafer substrate.

Figure 9B:
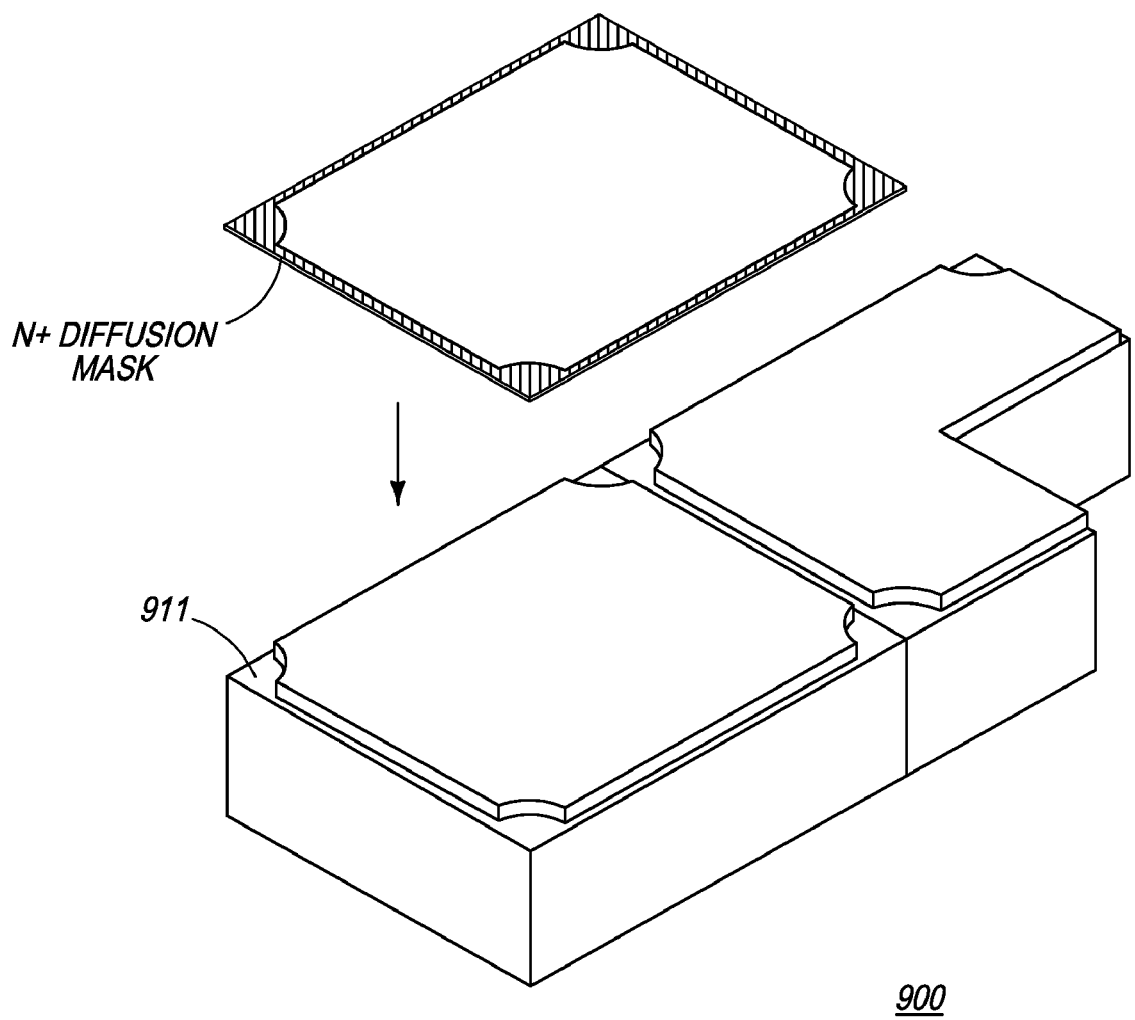

As shown in FIG. 9b, in step 910, the substrate wafer 900 is then subjected to n+ top side masking. An oxide pattern is etched on the front side of the wafer. The front side of the wafer is then subjected to n+ diffusion. The n+ drive-in oxidation is thus accomplished. The front side of the device wafer is heavily doped via phosphorus diffusion or high dose implantation, followed by deep driving, thus obtaining a relatively deep n+ diffused region 911.

Figure 9C:
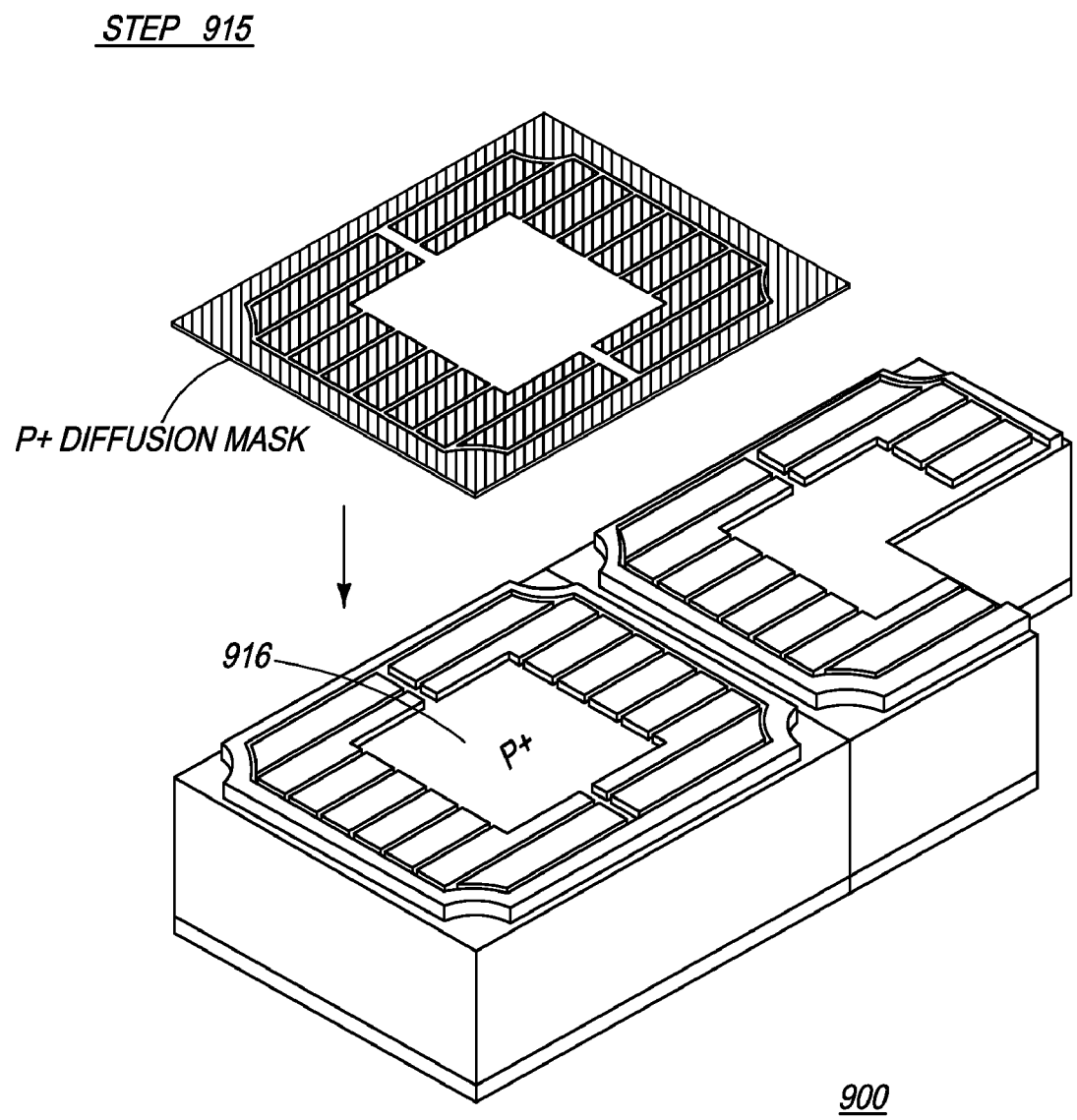

In step 915, as shown in FIG. 9c, the front side of the wafer is subjected to p+ photolithography, etching, and p+ diffusion and drive-in oxidation, resulting in p+ diffused layer 916. Thus, the backside illuminated photodiode arrays of the present invention have front side contacts. Metal contact pads are provided on the front and are in electrical communication with the anode and cathode metal structures. The n+ and p+ doped regions, shown as 911 and 916 in FIGS. 9b and 9c, respectively, are positioned directly below the front surface of the device wafer. Thus, regions 911 and 916 share their top face with front surface of the device wafer 900. Heavily doped regions 911 and 916 may be doped with a suitable impurity of a selected conductivity type, such as p-type or n-type, as described above. Diffusion regions 911 and 916 are preferably doped with opposite impurities of selected conductivities. For example, but not limited to such example, if region 911 is doped with suitable impurity of a selected conductivity of n-type, then region 916 would be doped with a suitable impurity of a selected conductivity of p-type.

Figure 9D:
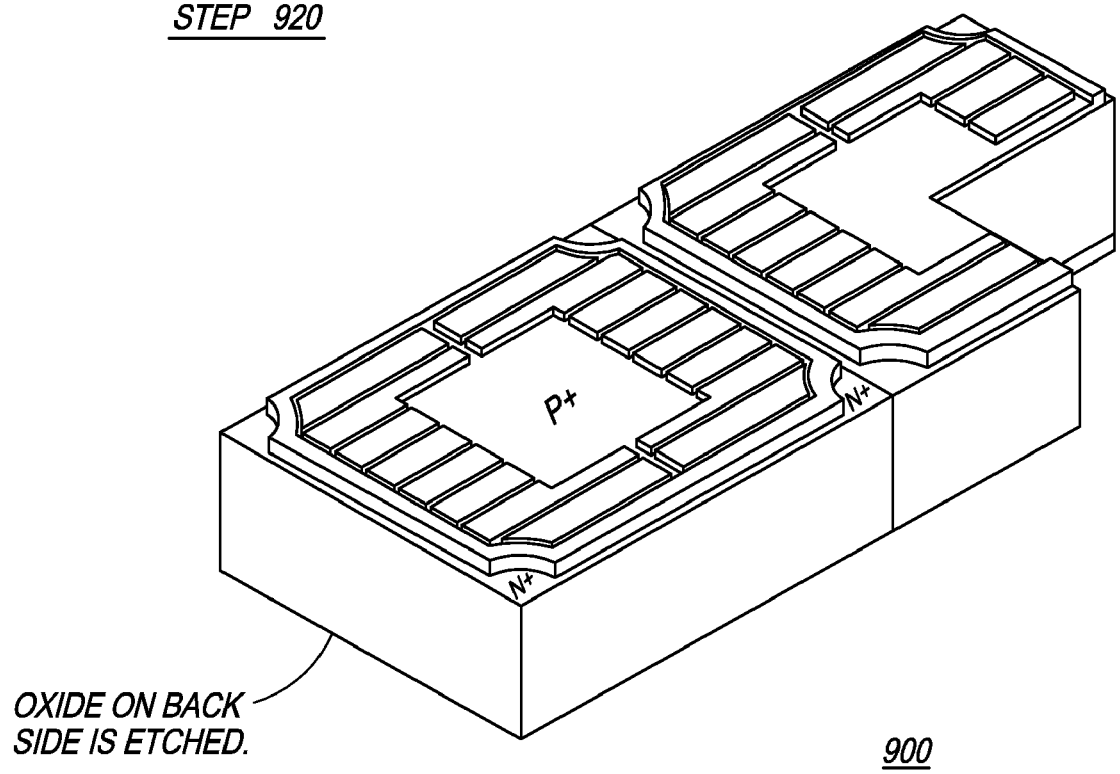

As shown in FIG. 9d, in step 920, the front side of the wafer is coated with a photoresist while an oxide layer is etched on the back side. The photoresist mask on the front side forms a contact window pattern. The photoresist mask is formed using any of the conventional photolithographic techniques including, but not limited to, optical, UV (i.e. ultraviolet), EUV (i.e. enhanced ultraviolet) photolithography, e-beam or ion-beam lithography, x-ray lithography, interference lithography, or any other similar technique.

Figure 9E:
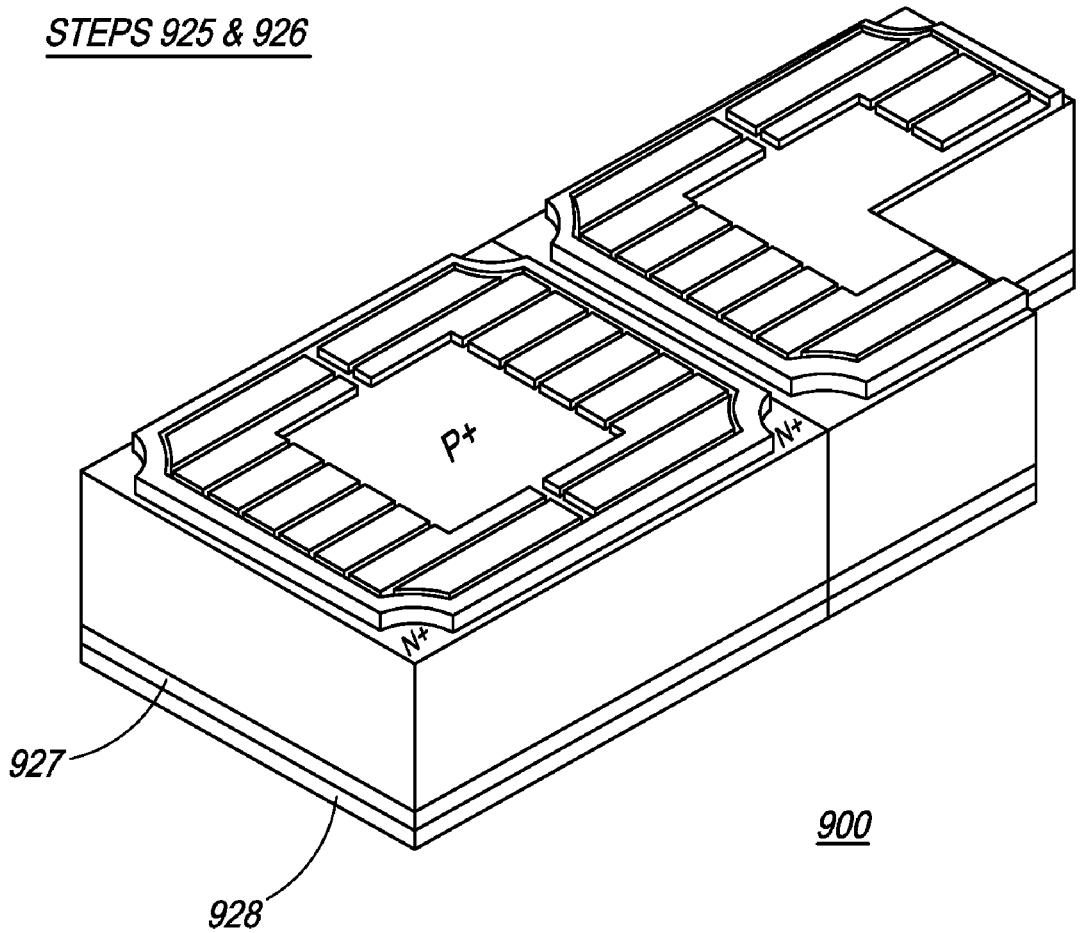

In step 925, as shown in FIG. 9e, a shallow n+ layer 927 is diffused on the back side. The n+ layer on the back side of the wafer improves the quantum efficiency at shorter wavelengths and reduces dark current (current leakage) of the photodiode. Smaller surface area portions of the active region are exposed via the fishbone masking pattern.

The back side is then subjected, in step 926 to thermal oxidation to grow the anti-reflective (AR) layer 928. Various anti-reflective coating designs, such as 1 layer, 2 layer, 3 layer, and 4+ layers may be employed. By way of example, and by no means limiting, the 1-layer anti-reflective coating design adopted herein utilizes thin film materials, such as oxides, sulfides, fluorides, nitrides, selenides, metals, among others. In one embodiment of the present invention, the antireflective layer 928 comprises $SiO_2$ AR (i.e. silicon dioxide antireflective). Preferably the $SiO_2$ AR 928 layer has a thickness of 900 Å.

Figure 9F:
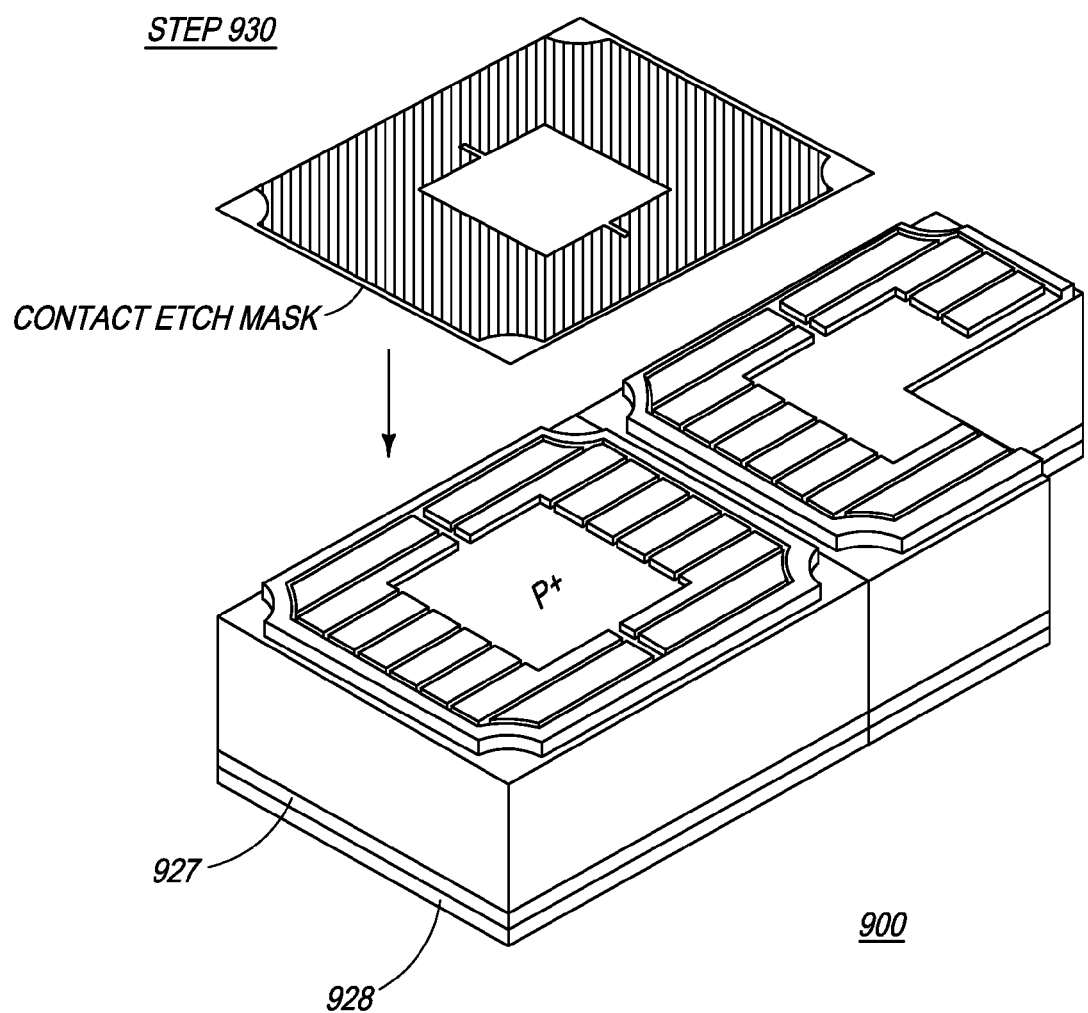

As shown in FIG. 9f, in step 930, a contact etch mask is used to etch a contact window into the front side of the wafer. The contact window is formed on the front side of the treated substrate wafer by using standard semiconductor technology photolithography techniques. The contact window oxide can then be removed by either standard wet or standard dry etching techniques as are well known to those of ordinary skill in the art.

Figure 9G:
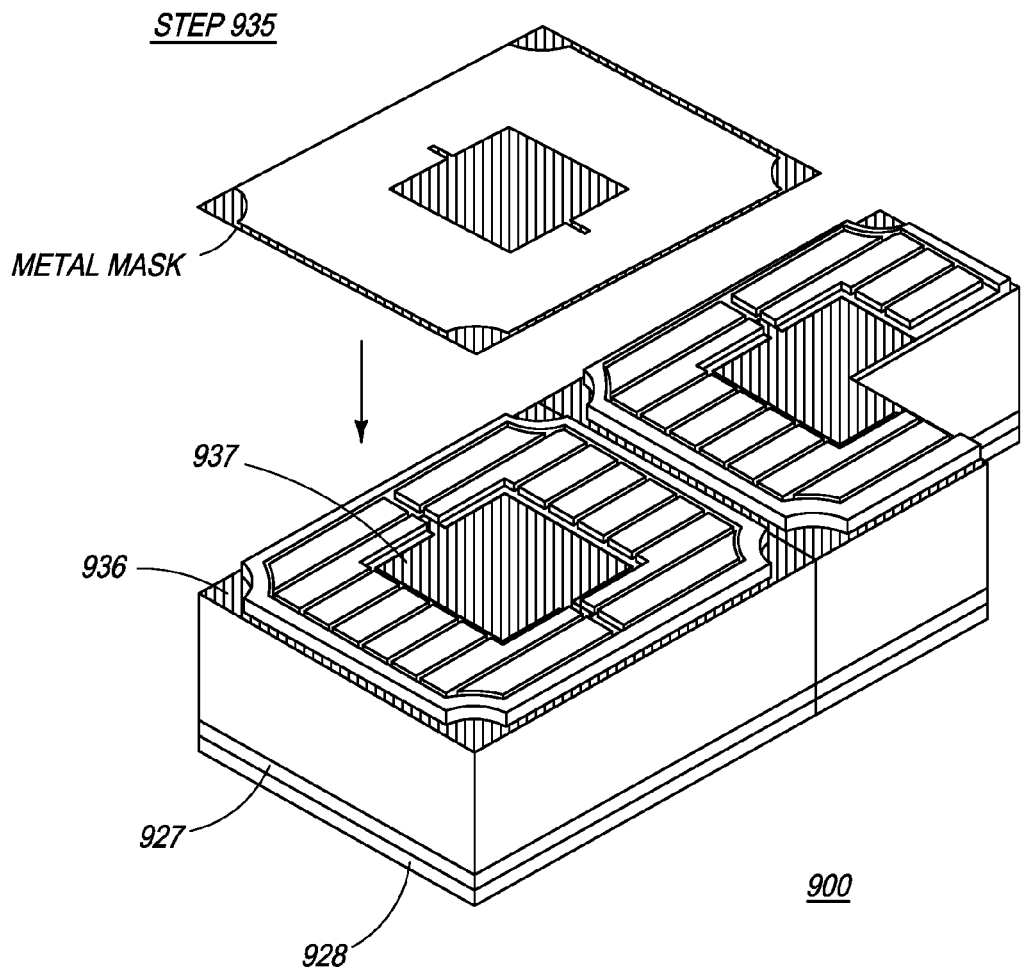

Finally, in step 935, as shown in FIG. 9g, the front side of the wafer substrate is subjected to metallization, metal masking, and subsequently, metal etching. Due to metallization of the area, the front side cathode contacts 936 and front side anode contacts 937 on device wafer 900 are on the front surface of the silicon device wafer 900.

Various modifications to the embodiments, disclosed herein, will be readily apparent to those of ordinary skill in the art and the disclosure set forth herein may be applicable to other embodiments and applications without departing from the spirit and scope of the present invention and the claims hereto appended. A person of ordinary skill in the art would appreciate that the novel aspects of the present invention can be implemented in various designs and methods. Thus, the present invention is not intended to be limited to the embodiments described, but is to be accorded the broadest scope consistent with the disclosure set forth herein.

The above discussion is aimed towards providing an embodiment incorporating the novel aspects of the present invention and it should be understood that the foregoing illustration is not the only application where the present invention can be reduced down to practice. The present invention can be suitably modified to incorporate other possible embodiments as well. The scope of the invention is defined solely by the accompanying claims and within the scope of the claims; the present invention can be employed in various other situations. For example, other device-to-device isolation, active are patterning, active area reduction, reduction of crosstalk, formation of electrical contacts via through holes, and reduction of radiation damage techniques could be employed while still staying within the scope of the present invention.

We claim:

1. A photodiode array comprising:
a substrate having at least a front side and a back side;
a plurality of diode elements, each having a plurality of edges, integrally formed in the substrate forming said array, wherein each of said plurality of diode elements has a center and comprises:
a p+ fishbone pattern on said front side, comprised of a plurality of ribs, wherein each of said ribs comprises a p+ diffused layer and has at least one end, and wherein a contiguous interconnect, comprising a p+ diffused layer and distinct from each of said ribs, encircles each of said ribs and is in direct contact with each at least one end of each of said ribs; an n+ region substantially conformally surrounding the contiguous interconnect; and
an anode pad in the center of each of said plurality of diode elements.

2. The array of claim 1 wherein a gap between each of said plurality of ribs of said fishbone pattern is in the range of 10 µm to 180 µm.

3. The array of claim 1 wherein a gap between the contiguous interconnect and a cathode pad is in the range of 25 to 75 µm.

4. The array of claim 1, wherein said substrate is made of n doped silicon.

5. The array of claim 4, wherein said substrate has a thickness ranging from 0.075 mm to 0.275 mm.

* * * * *